(12) United States Patent
Raymond et al.

(10) Patent No.: US 10,369,832 B2
(45) Date of Patent: Aug. 6, 2019

(54) OPTICAL SECURITY ELEMENTS WITH OPAQUE MASKS FOR ENHANCED LENS-TO-PRINTED PIXEL ALIGNMENT

(71) Applicant: LUMENCO, LLC, Englewood, CO (US)

(72) Inventors: Mark A. Raymond, Littleton, CO (US); Hector Andres Porras Soto, Littleton, CO (US)

(73) Assignee: LUMENCO, LLC, Englewood, CO (US)

( * ) Notice: Subject to any disclaimer, the term of this patent is extended or adjusted under 35 U.S.C. 154(b) by 2 days.

(21) Appl. No.: 15/980,352

(22) Filed: May 15, 2018

(65) Prior Publication Data

US 2018/0264866 A1  Sep. 20, 2018

Related U.S. Application Data

(63) Continuation-in-part of application No. 15/782,077, filed on Oct. 12, 2017, now Pat. No. 10,279,617.
(Continued)

(51) Int. Cl.
*B42D 25/30* (2014.01)
*B42D 25/351* (2014.01)
(Continued)

(52) U.S. Cl.
CPC .............. *B42D 25/30* (2014.10); *B05D 1/00* (2013.01); *B05D 3/107* (2013.01); *B41J 2/2132* (2013.01);
(Continued)

(58) Field of Classification Search
CPC .......... B42D 25/30; B42D 25/29; H04N 1/00; H04N 1/6083; B41J 2/2132; B05D 3/107; B05D 1/00; G03F 7/0025
(Continued)

(56) References Cited

U.S. PATENT DOCUMENTS

2015/0198749 A1* 7/2015 Ye .............................. G02B 5/18
359/581

FOREIGN PATENT DOCUMENTS

EP         0330733 A1    9/1989
WO    2003005075 A1    1/2003
(Continued)

OTHER PUBLICATIONS

International Search Report for International Application No. PCT/US2018/032782 received Dec. 7, 2018.

*Primary Examiner* — Justin V Lewis
(74) *Attorney, Agent, or Firm* — Marsh Fischmann & Breyfogle LLP; Kent A. Lembke

(57) ABSTRACT

Products, such as branding labels and currency, fabricated to include an optical security element. The optical security assembly may include a carrier film or substrate. An image element, e.g., a printed ink layer, is provided on a first surface of the carrier film/substrate, and the optical security assembly further includes an array or plurality of micro lenses on a second surface of the carrier film/substrate opposite the image element. In order to make the registration and print requirements easier, a mask is provided between the printed ink layer to define color pixels, and the printed ink layer is provided in the form of color blocks in a checkboard pattern with each block aligned with a portion of the mask and a subset of the holes or openings that define the viewable color pixels.

45 Claims, 26 Drawing Sheets

Related U.S. Application Data

(60) Provisional application No. 62/509,307, filed on May 22, 2017, provisional application No. 62/408,122, filed on Oct. 14, 2016.

(51) Int. Cl.

| | |
|---|---|
| *B42D 25/42* | (2014.01) |
| *B42D 25/45* | (2014.01) |
| *B42D 25/355* | (2014.01) |
| *B42D 25/29* | (2014.01) |
| *H04N 1/60* | (2006.01) |
| *G03F 7/00* | (2006.01) |
| *B05D 1/00* | (2006.01) |
| *B05D 3/10* | (2006.01) |
| *B41J 2/21* | (2006.01) |
| *H04N 1/46* | (2006.01) |
| *B41M 3/14* | (2006.01) |
| *B42D 25/305* | (2014.01) |
| *B42D 25/324* | (2014.01) |
| *B42D 25/485* | (2014.01) |
| *B42D 25/373* | (2014.01) |

(52) U.S. Cl.
CPC ............... *B41M 3/14* (2013.01); *B42D 25/29* (2014.10); *B42D 25/305* (2014.10); *B42D 25/324* (2014.10); *B42D 25/351* (2014.10); *B42D 25/355* (2014.10); *B42D 25/373* (2014.10); *B42D 25/42* (2014.10); *B42D 25/45* (2014.10); *B42D 25/485* (2014.10); *G03F 7/0025* (2013.01); *H04N 1/46* (2013.01); *H04N 1/6083* (2013.01)

(58) Field of Classification Search
USPC .......................... 283/67, 70, 72, 94, 98, 901
See application file for complete search history.

(56) References Cited

FOREIGN PATENT DOCUMENTS

| | | |
|---|---|---|
| WO | 2005052650 A2 | 6/2005 |
| WO | 2011138039 A1 | 10/2011 |
| WO | 2014041121 A1 | 3/2014 |

\* cited by examiner

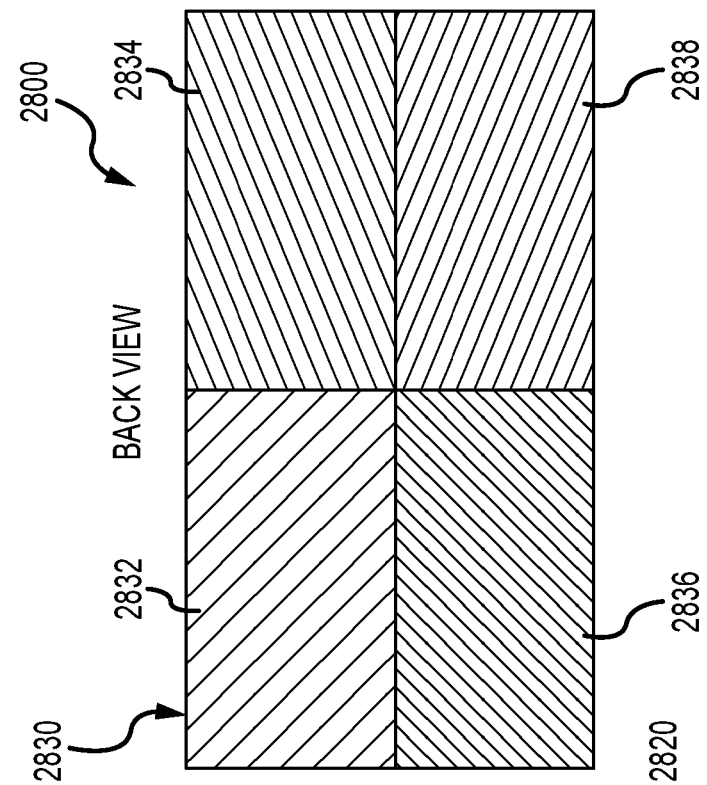
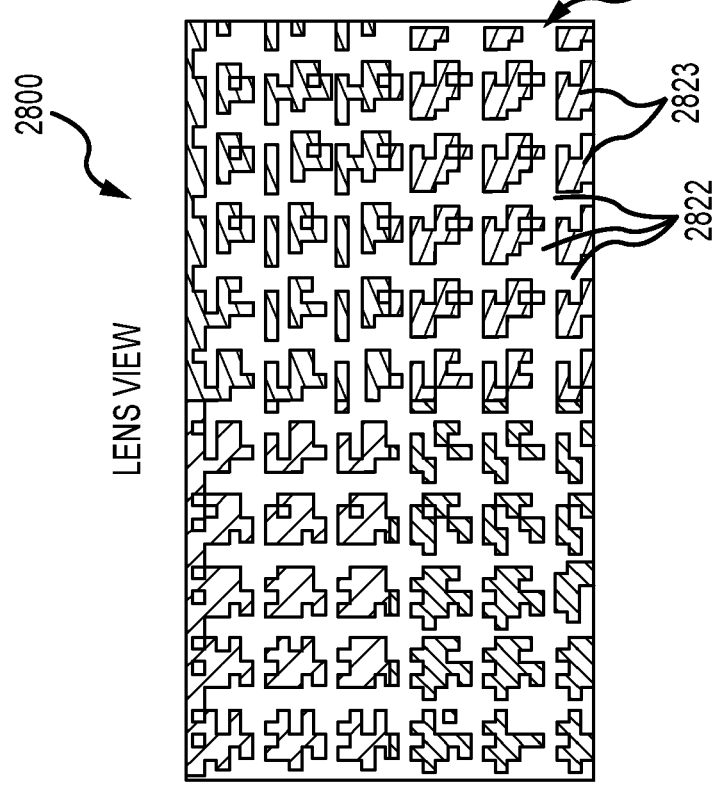
FIG. 29A
FIG. 29B

OPTICAL SECURITY ELEMENTS WITH OPAQUE MASKS FOR ENHANCED LENS-TO-PRINTED PIXEL ALIGNMENT

CROSS-REFERENCE TO RELATED APPLICATIONS

This application is a continuation-in-part (CIP) application of U.S. patent application Ser. No. 15/782,077, filed Oct. 12, 2017, that claims priority to U.S. Provisional Application No. 62/408,122, filed Oct. 14, 2016, and this application also claims priority to U.S. Provisional Application No. 62/509,307, filed May 22, 2017. All three of these applications are incorporated herein by reference in their entireties.

BACKGROUND

1. Field of the Description

This description is generally directed toward products such as polymer and paper bank notes (or currency) with optical security features, and, more particularly, to a new configuration for an optical security element for products that provides high quality color imagery by addressing prior problems with registration during printing processes by forming an opaque mask (or masking layer of opaque material) for each different, individual color to be printed in the ink layer (or image layer) positioned under a lens array in the optical security element.

2. Relevant Background

There are many products presently manufactured and distributed with optical security features so as to try to limit copying and counterfeiting. One of the most prevalent of these is currency of a country used daily in commerce. Other examples include tags or labels provided on clothing and other consumer items and credit and bank cards. It is desirable to provide optical security features to these and other products with minimal cost while also providing high levels of anti-counterfeiting protection. The anti-counterfeiting market is rapidly growing worldwide with anti-counterfeiting elements placed on a wide range of items such as upon currency (e.g., on a surface of a paper bill to help prevent copying) and on labels for retail products (e.g., labels on clothing showing authenticity).

Security features that are provided on paper can also be provided on polymer bank notes. Additionally, though, new security features that cannot be provided with paper currency can be provided with polymer bank notes because the substrate or body of the bank notes can be provided to be transparent (herein, "transparent" is intended to mean translucent to transparent to light). Hence, a transparent window may be provided that is used to display a security image that allows the bank note to be authenticated. An optical security feature may take the form of a lens or lens array (e.g., a lenticular lens array (linear lenses) or an array of round, hexagonal, aspherical, or other-shaped lenses) that is used to display an image printed on an opposite side of the transparent substrate (e.g., an interlaced image). The displayed or visible image may be a three dimensional (3D) image, an image that is animated with movement of the bank note (or with differing viewing angles), an image provided by a full volume pixel map or moiré pattern, and/or provide other optical effects available through the use of lenticular, diffraction, and other optical technologies.

In any type of full color printed lens array (e.g., a lens array with linear, round, hex, aspheric, or other-shaped lenses paired with a printed ink or image layer) when multiple colors are used in the ink layer, all of the colors are printed under each lens. In other words, pixels (or printed dots) from an interlaced image used to create the print files or "plates" are provided under each lens of the lens array. FIG. 1 shows an exemplary optical security element 10 that includes a lenticular lens array 12 that focuses (as shown with arrows 13) light onto an ink layer 16 that is printed upon an opposite side 15 of a clear substrate 14 (or upon the back of the lens array 12 itself). In this conventional lenticular element 10, two or more colors are printed in the ink layer 16 underneath each lens, and this often leads to two colors being printed in the same position or with overlapping of the two (or more) colors of ink due to registration limitations of the printer or printing process. Hence, a viewer sometimes will see a lower quality color image with ghosting or other problems as the lenses 12 focus 13 upon two or more colors from the same viewing angles.

The registration requirements during printing increase dramatically as the pitch or frequency of the lenses increase. In other words, printing a linear lens at 75 LPI (lenses per inch) in a 4-color process is difficult but is far easier than a pixel-mapped round lens in multiple colors at 1,200 lenses per inch in two axes. The registration requirements for multiple colors under one lens can be as difficult as having a registration tolerance of less than 1 micron in two axes to get the proper frames in the proper colors back to the viewer. In web and sheet-fed printing processes, movements of 30 to 300 microns are common and often within specification of the manufacturer of the equipment.

Since in traditional lens technologies all of the colors in the image must be printed under each individual lens for the image to work properly to the viewer, these tolerances are very small. For instance, in a 75 LPI lens that has a focal length of about $18/1000$-inch, a normal print resolution of about 2400 DPI (dots per inch, with a theoretical dot size of 0.000417 inches) is used. The width of the lens is about 0.0133 inches. For a typical image to be printed, this is divided into about 8 segments or equal to 0.001666 inches per image frame. For this to work to the viewer for proper viewing, these image frames in a linear lens are generally printed in a 4-color process or can be individual colors (e.g., a CMYK color model used in color printing using four inks of cyan, magenta, yellow, and key (or black)). This means that each of the images must register to within about the amount of each image frame under each lens. While this can be done with traditional sheet-fed equipment, the dynamics get far more difficult as the lenses get smaller. Further, the registration requirements are not just in one axis, but, instead, they are in two axes (both X and Y or side to side and up and down).

One specific example is that a security thread for currency may have 1,200 lenses per inch or be about 21µ in diameter. In order to create a 3D or animated image, the number of image frames may be about 10 frames in two axes to achieve this. This equates to about a 2µ pixel size per each frame. In order to make an image work and in multiple colors for a viewer, the registration requirements are about 0.5µ or less, which is impossible with any known processes.

As is understood in the industry, imaging systems for micro lenses create the need for extremely high-resolution imaging or printing systems, especially with lenses with focal lengths of less than about 125 microns. Printing pixels is especially difficult because the required resolution for images and the resulting printing using any traditional method such as gravure, flexography, offset, screen letterpress, or any other inking method requires an accurate reproduction of the target pixels or image icons. Often times, high resolutions of over 10,000 DPI can be achieved in engraved cylinders, plates, and the like, but the images or pixels are greatly distorted in the translation of the printing on the back of the lenses or other substrate that may be laminated to the lenses. In some cases, such with very fine magnifying moirés, resolutions of more than 20,000 DPI are needed for focal lengths under 30 microns and lenses under 30 microns in diameter.

In most cases, the reality is that it is difficult to actually resolve even twenty-five percent of the resolution present in the plating or cylinder engraving on the substrate. This results in issues such as poor image quality with the lenses, ghosting, blurred images, and so forth. Dot "gain" is also a large problem when printing under micro lenses because it causes the images to ghost or not function at all. It is not unusual to have a thirty to fifty percent dot gain when printing fine images under lenses, which renders the image unreadable and useless as part of an optical security element. This security element is best used in currency threads, currency patches, and so forth utilizing micro-lenses from about 35µ in diameter to about 20µ in diameter with focal lengths from about 20µ to about 40µ. This technology can be used in a reflective or transmissive mode.

One continuing problem with fabricating optical security elements is that in order to have enough contrast, one has to apply enough ink for the image to remain bright to the viewer through the lenses. However, with any traditional printing method, increasing the density of the ink causes the ink dots to expand larger than the DPI desired to print the image cleanly. As this happens, the dot over-fills the image frame in the interlaced image, which causes the produced image to be blurry or even fail to resolve for a viewer. Making the problem worse (as discussed above), printing with multiple colors is especially challenging because the images must be registered in two axes perfectly or in exactly the same optical pitch (i.e., frequency of the optical pitch to the lens array) as desired. This ratio may be one-to-one or something less or more between the colors, image icons, or pixel sets depending upon the desired visual effects to be provided by an optical security element. In a web printing method, for instance, the stretch of the film between printing units can be problematic as it makes it difficult to maintain the desired relationship between the lenses and the printing. A movement of even one or two microns between printing of two colors can result in blurred images or other problems.

Hence, there remains a need for new designs of optical security elements and associated printing/fabrication process that make the registration requirements more forgiving, especially for thin security films and lenses that are not linear such as for the round, square, hexagonal and aspheric lenses used in many optical security elements.

SUMMARY

Briefly, a lens-based display apparatus or assembly is described herein that is useful as an optical security element.

According to one aspect of the description, a method is provided for fabricating a lens-based optical security element. The method includes: (a) using color separation to generate a plate for each of at least two colors from a digital interlaced image, each of the plates including a set of digital data defining a number and a location of pixels of a particular color; (b) dividing each of the plates into a plurality of equally sized sections; (c) identifying a subset of the sections from each of the plates, with a different pattern being used to identify each of the subsets of the sections and with the different patterns being configured such that there are no co-located ones of the sections; (d) generating a combination plate including all of the subsets of the sections of the at least two colors; (e) processing the combination plate to form a file defining a mask with openings at the locations of the pixels in the subsets of the sections and with opaque areas at locations in the combination plate free of the pixels in the subsets of the sections; (f) forming a mask using the file defining the mask; (g) forming a printed image using a different color of ink to print a color block that is matched in size and location with the subsets of the sections; and (h) mating the mask and the printed image with a lens array, with each of the color blocks in the printed image positioned underneath a differing subset of lenses of the lens array.

According to some embodiments of this method, the different patterns used to identify each of the subsets of the sections are configured such that the subset of sections in the combination plate have a checkerboard arrangement. The forming steps and the mating step can be performed such that the mask is sandwiched between the printed image and the lens array. The lens array may be a sheet of transparent material with a plurality of linear lenses, round lenses, aspherical lenses, square lenses, or hexagonal lenses (e.g., micro lenses with any of these configurations).

According to another aspect of the description, a method is provided for fabricating an optical security element. The method includes generating, using color separation, a plate for each of at least two colors from a digital interlaced image, and each of the plates includes a set of digital data defining a number and a location of pixels of a particular color. Further, the method includes dividing each of the plates into a plurality of equally sized sections, and then identifying a subset of the sections from each of the plates for use in displaying a color three dimensional (3D) or animated image. Often, a different pattern is used to identify each of the subsets of the sections, and the different patterns are configured such that there are no co-located ones of the sections. The method also includes forming a mask on a planar back surface of a lens film that includes a lens array on a surface opposite the planar back surface, and the mask includes holes corresponding to the location of the pixels in the identified subsets of the sections and includes opaque masking elements in areas between the holes. Additionally, the method includes forming a printed image using two or more different colors of ink to print blocks corresponding to the identified subsets of the sections of each of the plates, and the printed blocks are arranged in sets of two or more in a checkerboard pattern. Further, the method includes mating the printed image with the lens film to form the optical security element with the mask sandwiched between the printed image the lens film, and each of the sections in the printed image are positioned underneath a differing subset of micro lenses of the lens array. The forming and mating steps may be performed concurrently in some cases.

In some implementations, each of the subsets of lenses includes a predefined number of lenses greater than 40,000 lenses with an outer dimension of less than 15 mils. Also, the two or more different colors can be chosen so that each of the sets of two or more blocks include a cyan block, a magenta block, a yellow block, and a black block. In some cases, the forming of the mask includes: (a) performing metallization to form a layer of metal upon the planar back surface generally with a vapor deposition chamber in a vacuum metallizing chamber; (b) printing a photoresist in a pattern corresponding to a negative or positive image over the metallization to the identified subset of the sections from each of the plates for use in displaying the color three dimensional (3D) or animated image; (c) dissolving portions of the layer of metal not covered by the photoresist printing exposing clear areas of the substrate using a chemical bath to dissolve the unprotected metal areas; and (d) removing the untreated metal to expose the opaque masking elements. In such cases, the layer of metal may be aluminum, gold, or silver, the photoresist can be a lacquer or a varnish, and the forming of the printed image may involve filling or covering the holes or clear areas in the mask with the two or more different colors of ink.

In some implementations of the method, the forming of the mask involves applying a layer of opaque ink on the planar back surface the lens film. In the same or other cases, the mask has an optical pitch with a 1 to 1 match to an optical pitch of the lens array, and the lens array focuses to the mask within plus or minus twenty percent of an ideal focus of lenses in the lens array. The method may be configured such that the optical security element is provided in or on a substrate of a banknote, a piece of currency, a financial card, a driver's license, an identification badge, a patch, a passport, or an authenticity label.

According to yet another aspect of the description, a lens-based display apparatus is taught that is useful as an optical security element. The apparatus includes a lens array with a first side comprising a plurality of lenses and a second side opposite the first side, and it further includes an ink layer comprising blocks formed of ink of a first color arranged in a first pattern and blocks formed of ink of a second color arranged in a second pattern differing from the first pattern. A mask is provided that is proximate to the second side of the lens array and positioned between the ink layer and the lens array. The mask includes a first set of openings associated with a first set of pixels that are filled or covered with the ink of the first color. Further, the mask includes a second set of openings associated with a second set of pixels that are filled or covered with the ink of the second color. The mask also includes opaque masking elements between the openings, and the first set of openings are arranged into a first set of sections that are arranged in a third pattern matching the first pattern of the blocks. Additionally, the second set of openings are arranged into a second set of sections that are arranged in a fourth pattern matching the second pattern of the blocks, and the first set of openings are located underneath a first set of the lenses of the lens array. Also, the second set of openings are located underneath a second set of the lenses of the lens array that differs from the first set of the lenses.

In some implementations of the apparatus, the first set of pixels corresponds with a subset of pixels of a first color plate for an interlaced image or, instead in some cases, for a magnifying moiré, and the second set of pixels corresponds with a subset of pixels of a second color plate for the interlaced image or magnifying moiré. In such implementations, the interlaced image is a full color image, and the mask includes third and fourth sets of openings associated with third and fourth sets of pixels from third and fourth color plates for the interlaced image. The printed image further may include blocks formed of ink of a third color and arranged in a third pattern and blocks formed of ink of a fourth color and arranged in a fourth pattern differing from the first, second, and third patterns.

In the same or other embodiments, the first and second patterns are selected such that the blocks of the first and second colors of ink are arranged in a checkboard pattern. The lenses can be micro lenses with an outer dimension less than 10 mils. Preferably, a 1 to 1 match is provided between optical pitch of the mask to the lens array. The mask may be a layer of metal formed by de-metallization of a metalized film to form the openings, or, instead, the mask may be a layer of opaque ink.

According to an additional aspect of the description, a method is provided for fabricating a lens-based display assembly or optical security element. The method includes using color separation to generate a plate for each of at least two colors from a digital interlaced image, with each of the plates including a set of digital data defining a number and a location of pixels of a particular color. The method also involves dividing each of the plates into a plurality of equally sized sections and then identifying a subset of the sections from each of the plates. Typically, a different pattern is used to identify each of the subsets of the sections, and the different patterns are configured such that there are no co-located ones of the sections. The method then includes generating a combination plate including all of the subsets of the sections of the at least two colors, and then processing the combination plate to form a file defining a mask with openings at the locations of the pixels in the subsets of the sections and with opaque areas at locations in the combination plate free of the pixels in the subsets of the sections. The method further includes forming a mask layer, using the file defining the mask, that includes holes corresponding to the pixels in the subsets of the sections and opaque masking elements corresponding to the opaque areas. Additionally, the method includes providing an ink layer over the mask layer using a different color of ink to print a color block that is matched in size and location with the subsets of the sections, thereby forming a checkboard pattern of the color blocks. The method involves mating the mask layer and the ink layer with a lens array, and each of the color blocks in the printed image are positioned underneath a differing subset of lenses of the lens array. The mask layer is sandwiched between the ink layer and the lens array with the holes covered or filled with the ink.

In this method, the lens array includes a plurality of round lenses, aspherical lenses, square lenses, or hexagonal lenses each with an outer dimension of less than 10 mils. In some useful cases, the mask layer has an optical pitch with a 1 to 1 match to an optical pitch of the lens array, and the lens array focuses to the mask layer within plus or minus twenty percent of an ideal focus of the lenses in the lens array. The pixels of the first color are often arranged in patterns under the lenses that differ from patterns of the pixels of the second color under the lenses, whereby the lenses exclusively focus for a viewer on locations of the pixels of the first color or the pixels of the second color.

BRIEF DESCRIPTION OF THE DRAWINGS

FIGS. 29A and 29B are lens and back views, respectively, of a larger portion or subsection of the optical security element of FIG. 28;

DETAILED DESCRIPTION

Figure 1:
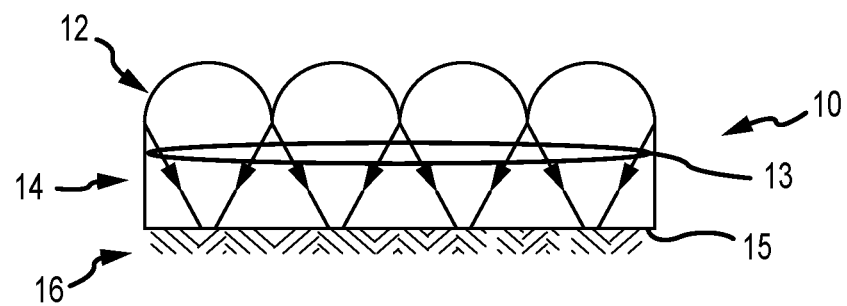
FIG. 1 illustrates a schematic side view (or functional block drawing) of a conventional optical security element with an ink layer providing two or more colors of ink (e.g., two or more colored stripes or pixels/dots) under the lenses of a lens array.

Briefly, the present description is directed toward products, such as branding labels, credit/debit/bank cards, and polymer bank notes, that are fabricated so as to include an optical security element (or feature or assembly), which is designed to provide enhanced optical focusing onto each color used in the printed image (or in the ink layer).

The optical security assembly may include a carrier film or substrate (transparent product body, in some cases, while other embodiments have an opaque substrate such as a paper layer). An image element, e.g., a printed ink layer, is provided on a first surface of the carrier film/substrate, and the optical security assembly further includes an array or plurality of micro lenses on a second surface of the carrier film/substrate opposite the image element (when the substrate/carrier film is transparent). The micro lenses are provided in an optical material layer deposited upon the second surface, and the lenses and the film/focusing substrate of the deposited optical material may be thought of as a "focusing element." As discussed above, the inventors recognized that printing multiple colors can be difficult due to registration errors or variances between processes of printing each color. For example, some printers or printing processes may have a registration error/variance in the range of 10 to 40 microns, with 20 microns being common for many commercially available printers.

In order to make the registration and print requirements easier, pixels can be isolated into sections or portions of the printed ink layer/printed image, which can then be arranged to align with or be located underneath predefined groups or sets of lenses (i.e., each set/group of lenses may be dedicated to focusing upon a particular color of ink) rather than having all of the colors under each lens. The resulting registration requirements are far less stringent, and the colors physically print better and are more clear (not on top of each other) when viewed through the lenses of the lens array of the optical security element.

However, it is not a simple task to modify and/or reorganize the pixels for the print files. First, the inventors determined that one solution to the print registration problem is that one can use multiple lenses (or a lens set) dedicated to one color and get the information back to the viewer. However, this should be done in an organized way while mapping the images. Second, the inventors determined that providing only one color under a lens is facilitated by the absence of data for the other colors in each of the lenses dedicated to just one color (e.g., a lens used to provide yellow would not have pixels of cyan underneath it in the ink layer). The pixels of the print files are organized under (or mapped to) the lenses so that only the data from a specific color appears under that lens set, and the other data is missing. It is also important that the data appear in the exact desired position relative to that data for each lens used to provide that color in the image viewed through or produced by a lens array. Conversely, the data for the other colors also contain data only from that lens set (or only pixels for that color) and are in the proper position under those lens sets.

In one preferred embodiment, exact numbers of lenses corresponding to colors are not beneficial in displaying each section/portion of a particular color, as it creates some unwanted visual patterns such as banding in the displayed/viewed image. The inventors recognized that it is far better to have a fractional number of lenses in both axes for each section/portion (say 4.5 rows and 4.5 columns or 4.5 rows and 5.5 columns) rather than even numbers (e.g., rather than 4 lenses in each row and column to provide 16 lenses or 4 lenses in the rows and 5 lenses in the columns to provide 20 lenses). A mis-registration between the colors may still be visible to the viewer with the new process as some color overlap will still be present (such as less than about 30 percent such as less than 20 percent and preferably less than 10 percent), but it is not nearly as sensitive as the traditional method of having all of the colors under the same lenses. Also, the colors tend to be more pure and clean as there is no (or at least less) overlap in the dots or pixels (as 70 percent or more of each section/portion of the printed image is focused as clean or non-overlapping pixels).

It is important to note that the data space occupied under each lens set (color set) cannot be common to both colors relative to the lens itself, or the colors will be on top of each other (as will the images). With regard to mapping or interlacing the images for printing, the inventors understood that traditional interlacing software by itself or without modification will not work for this type of mapping or interlacing. New software (or modified software) was developed for removing data associated with other colors from each of the lenses, and the printing method and resulting new optical security element are described in detail following discussion of FIGS. 2 and 3.

Figure 2:
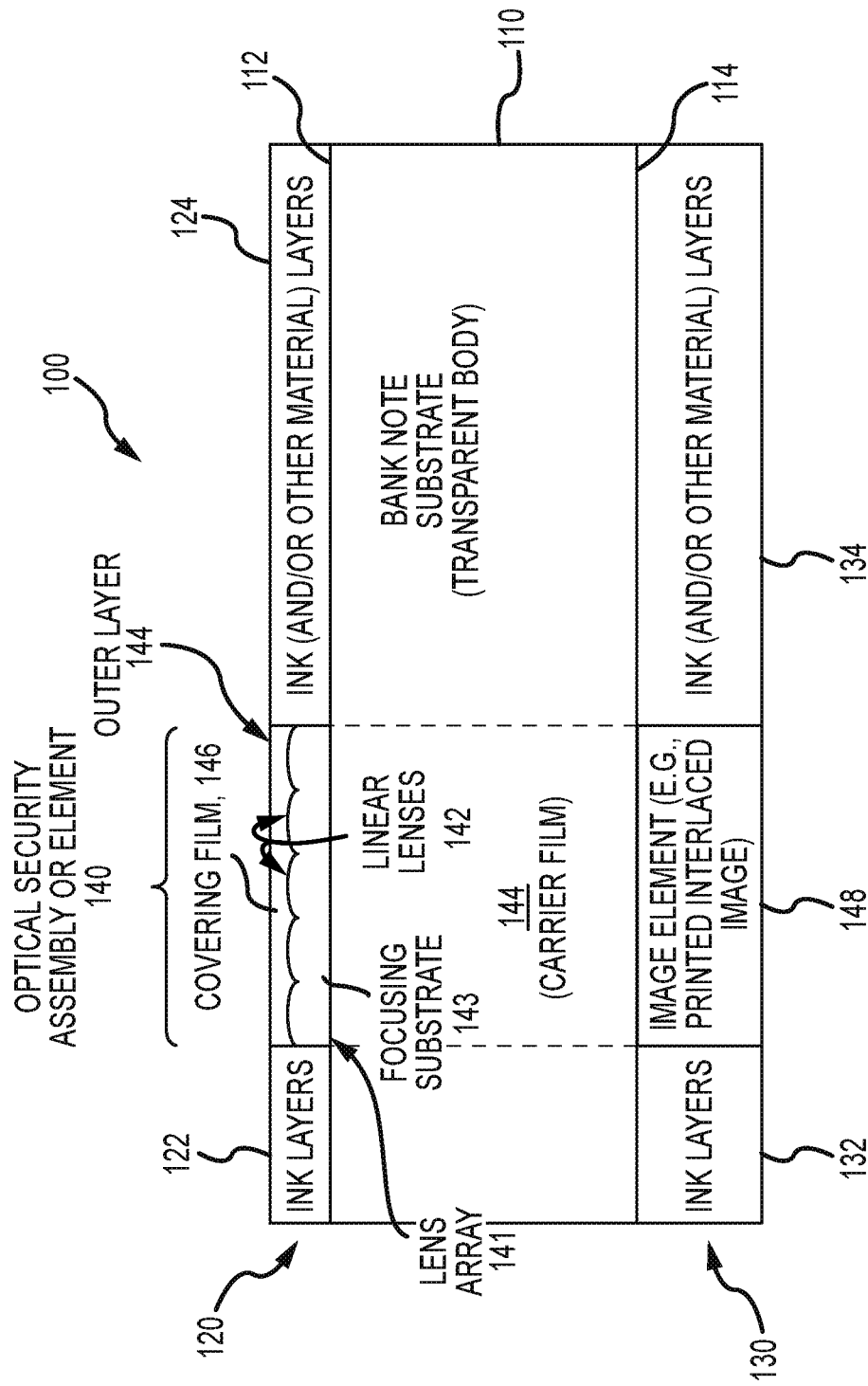
FIG. 2 illustrates a schematic side view (or functional block drawing) of a product or item (such as product branding label, a credit/debit card, a polymer bank note, or the like) including an optical security element (or feature or assembly) of the present description.

Many products or items may be fabricated to include an optical security element or assembly of the present description, but it may be useful to illustrate one particular product to show one intended and beneficial use. FIG. 2 illustrates schematically (or with a functional block-type drawing) a polymer bank note 100 of the present description, but it will be understood the optical security element features are also useful on paper banknotes and other non-transparent bodies/substrates. The bank note 100 is "polymer" in that it includes a body or substrate 110 that is formed of a transparent (e.g., translucent to transparent to light) plastic or polymer such as, but not limited to, a polypropylene such as biaxially oriented polypropylene (BOPP). The note substrate 110 is formed from a thin sheet of the polymer or plastic such that the body is planar with first and second opposite sides or surfaces 112, 114, with many countries having currency that is rectangular in shape that is 2 to 3 inches in width by 4 to 6 inches in length. The substrate 110 is "thin" in that it typically will have a thickness (as measured between sides/surfaces 112 and 114) of about 70 to 85 microns with 75 microns being a common thickness for the transparent substrate 110.

The bank note 100 further includes materials including layers of ink and other compounds to provide imagery and information associated with the currency definition or design for the country. As shown, the note 100 includes an upper currency image stack 120 and a lower currency image stack 130 that are used to display imagery and data associated with the front and back of a particular currency run, e.g., the imagery may differ for each denomination of a country's currency and the imagery may be updated periodically (such as to show a different country leader's image). The upper currency image stack 120 is shown to include first and second sets of ink (and/or other material) layers 122 and 124, and, likewise, the lower currency image stack 130 is shown to include first and second sets of ink (and/or other material) layers 132 and 134. The layers 122, 124, 132, 134 may include a base layer (e.g., a layer of white ink) followed by several other layers to print differing colors of an image.

The techniques for applying the image stacks 120, 130 are well known in the currency industry and, hence, are not explained in detail herein. For this description, it is more relevant that the ink layers 122, 124, 132, 134 increase the overall thickness of the bank note, and this build up thickness can be used to provide a focusing element 141 on one side 112 of the note substrate 110 and an image element (e.g., layers of ink providing a printed interlaced image or other imagery) 148 on the opposite or second side 114 of the substrate 110 without bumps or bulges that could negatively affect later use and processing of the bank note 100 and without an exposed profile/surface that could readily be copied/counterfeited. For example, the thickness of the ink layers 122, 124 (and also ink layers 132, 134) may be in the range of 7 to 25 microns with a thickness in the range of 10 to 20 microns and, in some cases, 12 to 18 microns being common in polymer bank notes presently in production.

In some useful but not limiting embodiments, it is desirable to design the bank note 100 such that any security features (including that of the optical security assembly or element 140) are provided without increasing the overall thickness of the note 100 and without providing a bulge or bump at the location of any of the security features. To this end, the bank note 100 is shown to include an optical security element or assembly 140 that is adapted, at least in this non-limiting example, to have an overall thickness that matches or is less than the overall thickness of the note 100 (e.g., thickness of the substrate 110 and ink layers 120, 130).

Figure 3:
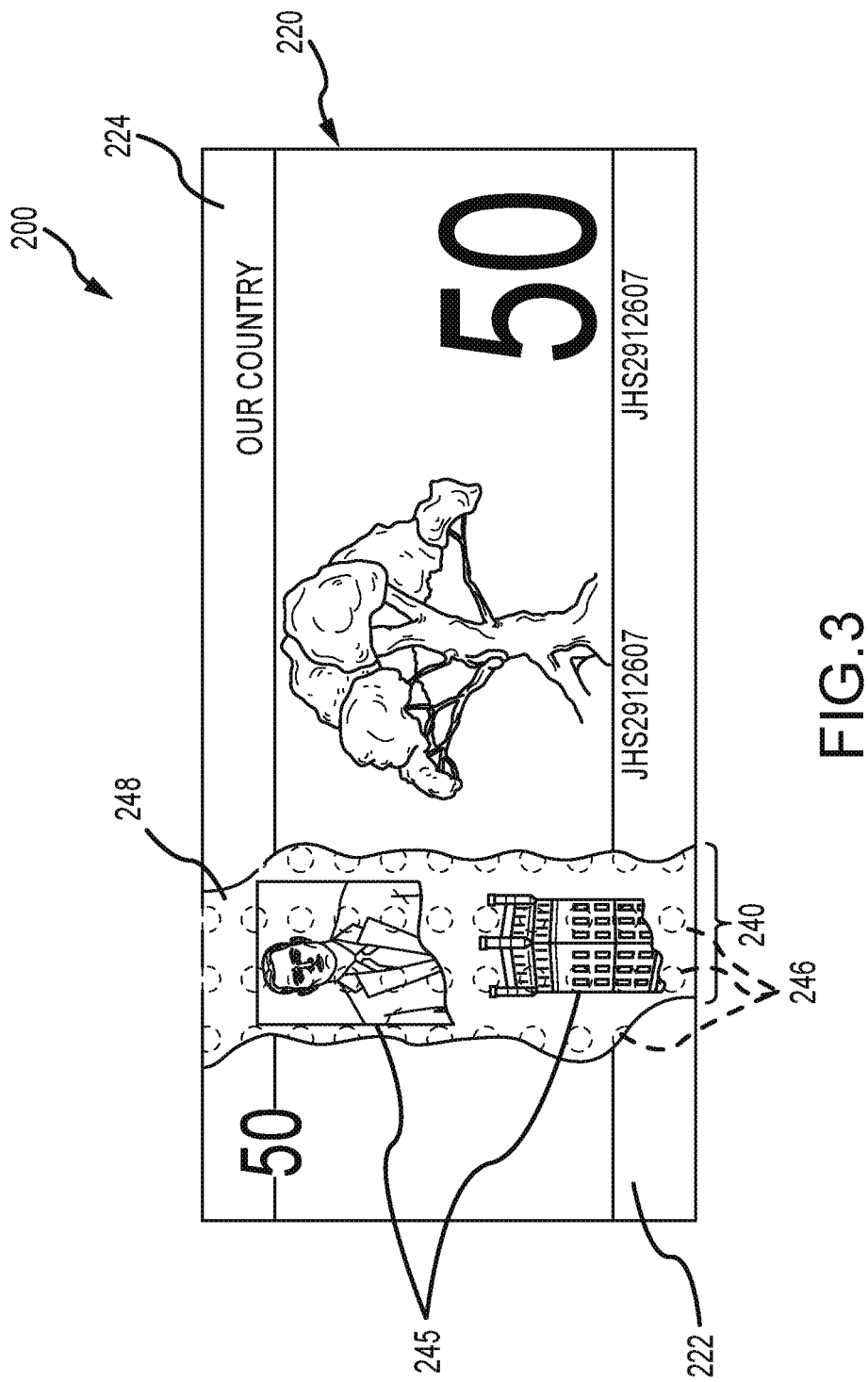
FIG. 3 is a top view of a polymer bank note with an optical security assembly of the present description similar to that provided/shown in the product of FIG. 2 but with an array of circular or round lenses rather than linear or elongated lenses as shown in FIG. 2.

The optical security assembly 140 includes a focusing element or lenticular lens array 141 attached to or, more typically, formed upon the first or upper side (or surface) 112 of the note substrate 110. In some cases, the focusing element 141 is cast or formed of the same material as the substrate 110, such as a transparent plastic or polymer (e.g., polypropylene or the like), but, in other cases, it is desirable to use a lower index of refraction material (relative to substrate 110) and the focusing element 141 is deposited such as with ultraviolet (UV) casting onto surface 112 of the substrate 110. The focusing element 141 is made up of a plurality of linear lenses 142 on a focusing substrate 143) such as concave lenticules, as shown in FIG. 2, that may have a circular, elliptical, hexagonal, square, or other cross-sectional shape or arrays of micro lenses with circular, hexagonal, square, or other bases may instead be utilized as shown in FIG. 3.

The optical security assembly 140 further includes an outer layer 144 including a plurality of fillers or fill portions (or covering film) 146, which are formed by applying material over the concave focusing element 141 so as to fill in and/or protect the lenses 142. In some embodiments, the outer layer 144 and its covering film 146 is eliminated or left off the optical security element 140, but in many cases, it may be desirable to provide material over the lenses 142 to provide a covering film 146 with an outer/exterior surface that is flat or planar and that is level or about level with the outer/exterior surfaces of the ink stacks 122, 124 (or ink layer 120) to avoid bumps or dips in the note 100 where the optical security element 140 is provided. The outer layer 144 may be formed of a transparent material such as a polypropylene with similar optical characteristics including an index of refraction as that of the focusing element 141 and/or the substrate 110. However, the outer layer 144 may also be provided with material having a higher index of refraction than the focusing element 141.

The optical security assembly 140 also includes an image element 148, which may be a layer of ink providing a printed interlaced image such as by interlacing of images corresponding with the concave lenticules/lenses 142 of concave focusing element 141, and the image element 148 is provided on the second or lower side 114 opposite the lenses 142. Significantly, the image element or ink layer 148 is printed using the techniques described herein such that different sets of the lenses 142 are paired with sections or portions of the ink layer 148 printed in differently colored inks. Hence, a first set of lenses 142 is aligned with or registered with the location of a first set of sections/portions of the interlaced image that are printed in a first color while a second set of lenses 142 is aligned with or registered with the location of a second set of sections/portions of the interlaced image that are printed in a second color (and so on for each additional color of ink used in the printed image element/ink layer 148).

The optical security element or assembly 140 further is shown to include a portion or segment 145 of the substrate 110 (e.g., a carrier film) that is sandwiched or positioned between the lenses 142 of the focusing element 141 and the image element 148. The lenses 142 of the focusing element 141 are configured (as discussed below) so as to focus through the substrate portion or carrier film 145 onto the back or second side 114 and the image element 148 provided there (or slightly in front of or behind the image element 148). The focusing element 141 is shown to be positioned in the gap or space between the ink layers 122 and the ink layers 124 while the image element 148 is positioned in the gap or space between the ink layers 132 and the ink layers 134, with portions of the image element (such as a slice or stripe of an interlaced image) 148 being aligned or registered with one (or more) of the lenses 142 of the concave focusing element 141.

Note, the bank note 110 may also be provided with a paper substrate for carrier film 145, and, in such an embodiment, the image element 148 would be printed on an upper surface of the carrier film/paper substrate 145 to be adjacent to the lens array 141 in the optical security element 140. Further, it should be understood that some preferred embodiments will include a mask as part of the image element 148, and, in these embodiments, the mask would be provided on the back or second side 114 of the carrier film 145 with the ink blocks of color/ink layer being provided on the mask (e.g., such that the mask is sandwiched between the micro lenses and the ink layer/ink blocks of color). Also, in a paper substrate embodiment, the mask would be provided between the lens array and the ink layer/color blocks, which may be printed on the paper substrate.

FIG. 3 illustrates a top view of an exemplary bank note 200 fabricated according to the present description with an optical security element or assembly 240 that provides focusing through the use of lenses 246 of a focusing element. The bank note 200 includes an optical security assembly 240 with an array or plurality of round lenses 246 that are, optionally, covered and/or filled in by an outer layer 248 of transparent material (e.g., material with the same or, more typically, a higher index of refraction than the material providing the lenses 246). In this embodiment of note 200, the lenses 246 are round-based lenses arranged in an array of rows and columns rather than the linear lenses 142 of FIG. 2, and the number typically will be much larger than shown with large diameter lenses 246 being shown for simplicity in illustration. Other base shapes may be used, and the lenses 246 may be arranged in a more random pattern and/or may have their chords contacting each other or adjacent lenses 246 instead of being spaced apart as shown.

The lenses 246 are used to focus light passing through the material of the focusing element and cover/outer layer 248 so as to display images 245 (e.g., 3D images, images with motion, and the like), which are provided via an image element/printed ink on the back or opposite surface of the note 200 and that allow a viewer to verify the authenticity of the bank note 200. As shown in FIG. 2, the bank note 200 includes a first or upper image stack or assembly 220 made up of a first set of ink (and/or other material) layers 222 and a second set of ink (and/or other material) layers 224. A gap or space is provided between the two sets of layers 222, 224, with the optical security assembly 240 with its lenses 246 and outer layer 248 positioned between the two sets of layers 222, 224. The two images 245 produced may be of two different colors, and the image element/printed layer is printed so that portions/sections associated with the first-colored image are under a first set of lenses 246 with portions/sections associated with the second-colored image under a second set of lenses 246 (that differs from the first set of lenses 246 such that lenses are dedicated to focusing on pixels/dots associated with a particular, single color).

Figure 4A:
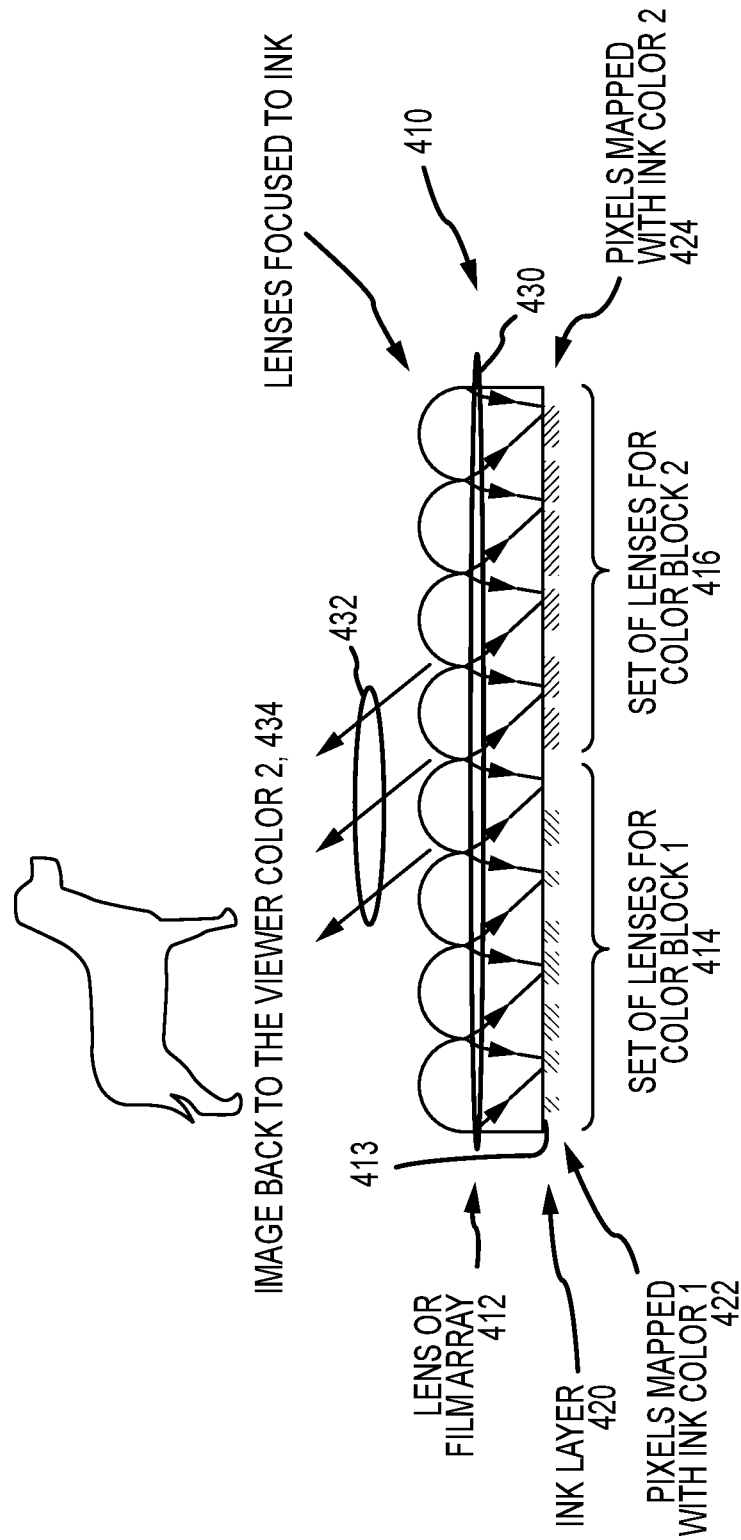
FIGS. 4A and 4B illustrate a schematic (or functional) side view of an optical security element (or feature or assembly) that may be used in a wide variety of products such as currency, product labels, credit cards, and the like to provide two images of differing color.
Figure 4B:
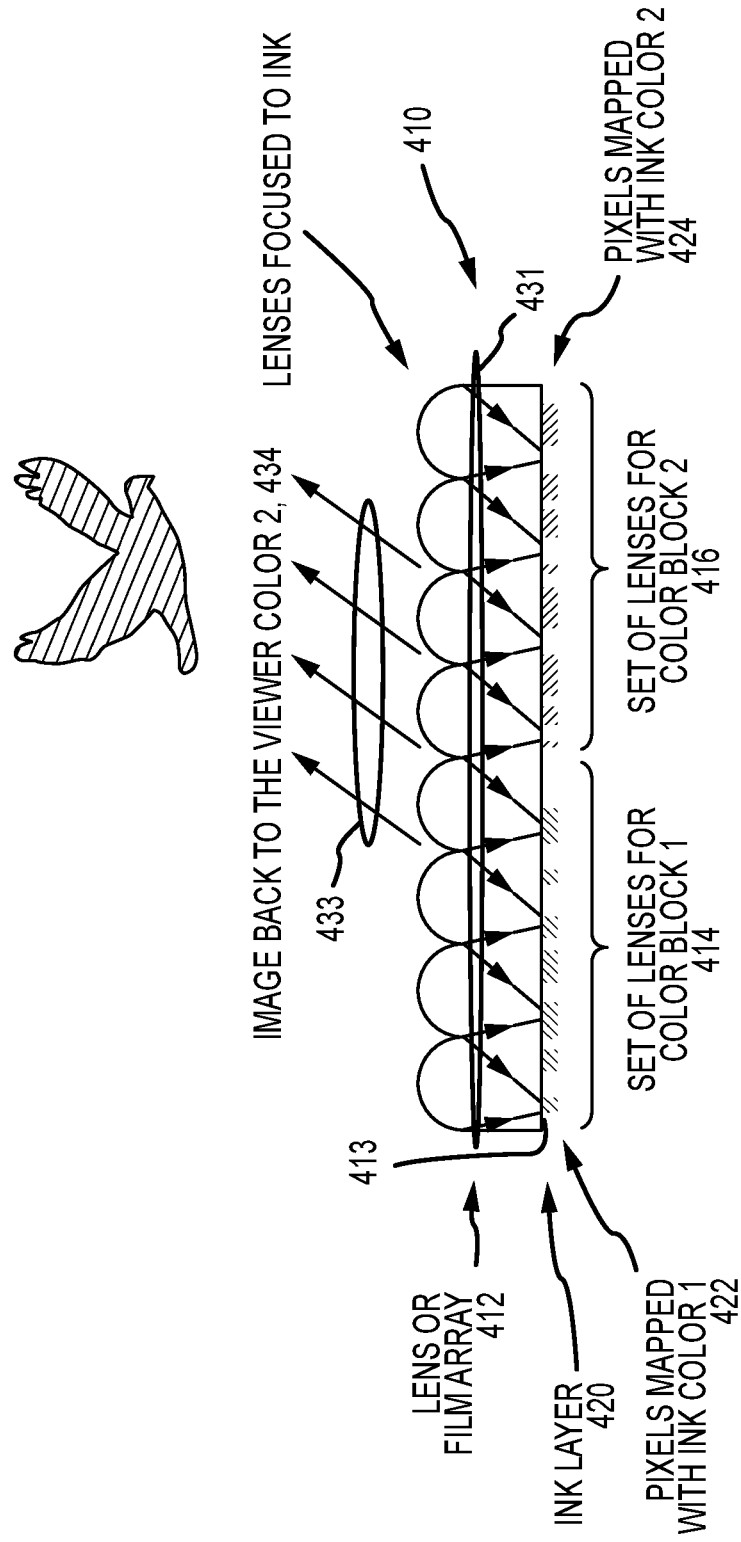

FIGS. 4A and 4B illustrate a schematic (or functional) side view of an optical security element (or feature or assembly) 410 that may be used in a wide variety of products such as currency, product labels, credit cards, and the like to provide two images of two different colors (with it being understood that any two images/frames may be presented using this way including two or more colors of the same multi-colored image). The feature 410 is adapted for providing a simultaneous image flip and color flip effect. In FIG. 4A, a viewer's eyes are positioned relative to the security element 410 (at a first point of view (POV)) to view a first image 434 via reflected light 432 of a second color (e.g., cyan) while, in FIG. 4B, a viewer's eyes are position relative to the security element 410 (at a second point of view (POV) differing from the first POV) to view a second image 435 via reflected light 433 of a first color (e.g., magenta). Significantly, the optical security element has an ink layer 420 configured to map sections/portions of the images (or its pixels) to differing sets of lens such that these sets of lenses only (or mostly (such as 70 percent or more)) focus on one color.

As shown, the security element (or more generally lens-based display element) 410 includes a lens array or film 412 that may be made up of a plurality of lenses of any of the shapes described herein. An image or ink layer 420 is provided on (or adjacent) an opposite or back side 413 of the lens array or film 412, and the ink layer 420 may be printed directly upon the lens array surface 412 or upon a substrate that is then positioned adjacent (e.g., abutting) the lens array surface 412. The ink layer or printed image 420 is divided up into a first set of sections or portions that are each to be printed in a first color (i.e., their pixels are printed in that first color) and a second set of sections or portions that are each to be printed in a second color (i.e., their pixels are printed in that second color). This is represented in FIGS. 4A and 4B with pixels 422 mapped to ink of a first color and pixels 424 mapped to ink of a second color.

Upon assembly, the first set of pixels 422 is paired with a set of lenses 414 selected for focusing on pixels of the first color (lenses 414 are focusing on blank sections in FIG. 4A), and the second set of pixels 424 is paired with a set of lenses 416 selected for focusing on pixels of the second color (lenses 416 are focusing on pixels of the second color). When only two colors are used, the sections/portions of pixels mapped to each color 422, 424 may be printed in a checkerboard manner with the sections of the two different colors being alternated in rows and then offset in columns like a common checkerboard (or chessboard) to evenly distribute the pixels between the colors (and images 434, 435 associated with each of the pixels colors). Hence, the sets of lenses used to focus on each the differing color sections/portions will also be arranged in a checkboard/chessboard manner over the ink layer 420 (i.e., over the pixels 422, 424 mapped to each color).

As shown in FIG. 4A, the POV of the viewer is such that the lenses in the array 412 are being used to only (or mainly such as 70 percent of the light 432) to reflect light 432 associated with the pixels of an image 434 of the second color. The pixels 424 in the image/ink layer 420 that are associated with this image 434 and are printed in the second color are located underneath (or are mapped to and aligned with) the set of lenses 416 designated for focusing 430 on the pixels 424 of this second color. In FIG. 4A, it can be seen that the focusing 430 is upon the pixels 424 mapped to the second color and not upon the pixels 422 mapped to the first color. This is achieved in part by providing no ink/coloring of pixels in the section/portion of the ink layer/printed image 420 associated with the first color, which can be seen by the focusing 430 by the set of lenses 414 associated with the first color being on blank or no data pixels in the pixel set 422.

Then, as shown in FIG. 4B, the POV of the viewer is such that the lenses of the array 412 are being used to only (or mainly) to reflect light 433 associated with the pixels of an image 435 of the first color. The pixels 422 in the image/ink layer 420 that are associated with this image 435 and are printed with ink of the first color and are located underneath the set of lenses 414 designated for focusing 431 on the pixels 422 of this first color (lenses 414 are focusing on pixels of the first color). In FIG. 4B, it can be seen that the focusing 431 is upon the pixels 422 mapped to the first color and not upon the pixels 424 mapped to (or printed in) the second color (lenses 416 are focusing on blank sections). This is achieved in part by providing no ink/coloring of pixels in the section/portion of the ink layer/printed image 420 associated with the second color, which can be seen by the focusing 431 by the set of lenses 416 associated with the second color being on blank or no data pixels in the pixel set 424.

Figure 5:
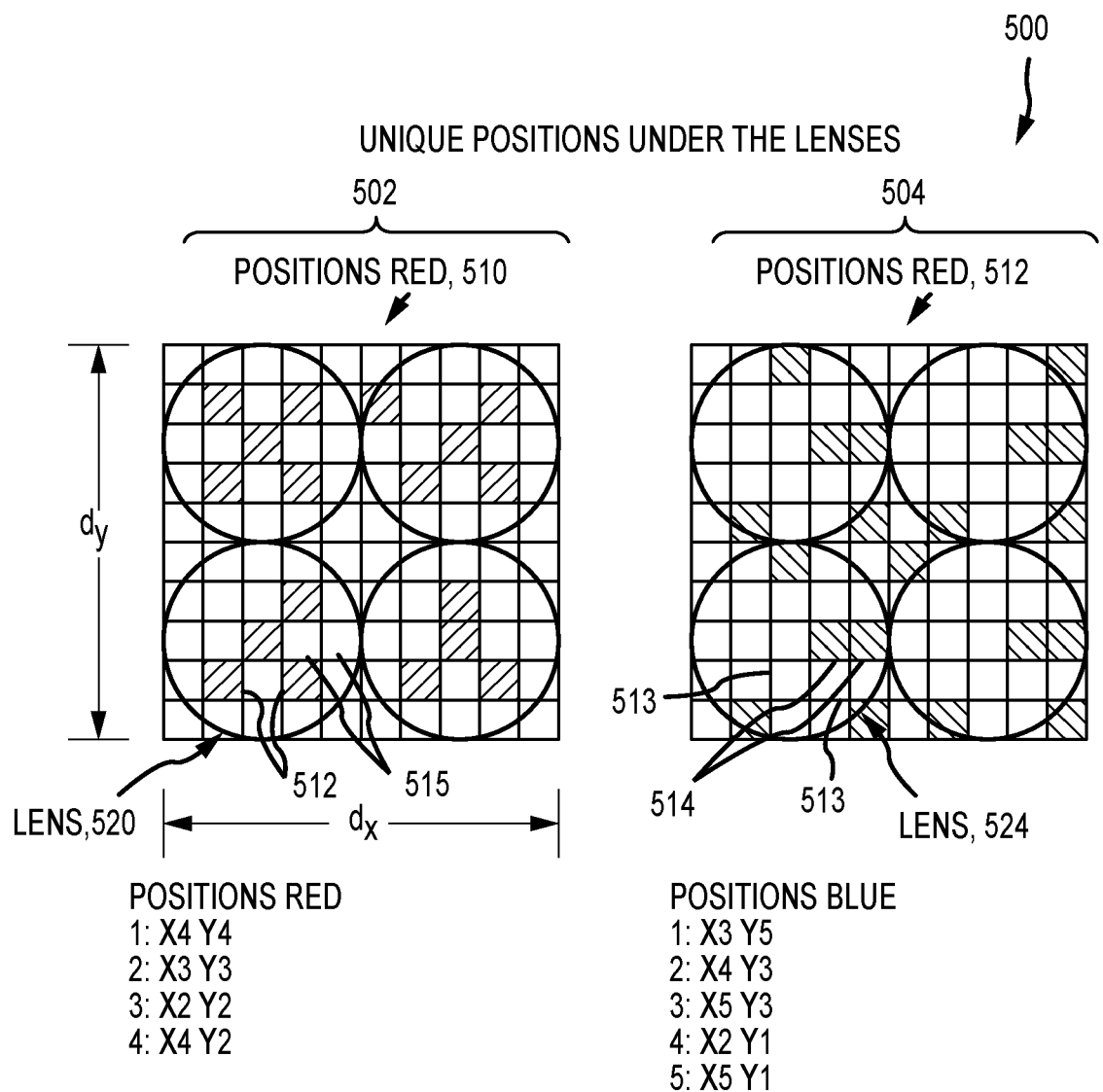
FIG. 5 illustrates with a schematic/functional top view a small portion of an optical security element showing a single section of the security element used for displaying a first image with a first set of pixels of a first color and an adjacent single section of the security element used for displaying a second image with a second set of pixels of a second color.

FIG. 5 illustrates with a schematic/functional top view a small portion of an optical security element 500 showing a first section 502 of the security element 500 used for displaying a first image with a first set of pixels 510 of a first color (e.g., labeled red in the drawing and provided in an ink or printed image layer of the security element 500) and a second section 504 of the security element 500 used for displaying a second image with second set of pixels 512 of a second color (e.g., labeled blue in the drawing and provided in the ink or printed image layer of the security element 500). Only two sections 502, 504 are shown, but a typical security element 500 would include tens to thousands of such sections to display each image (each color of an image and so on). Also, the number of lenses and pixels is shown to be relatively small for ease of illustration with it being understood that the principles taught herein are scalable up to each section 502, 504 including tens to hundreds of lenses and pixels under each lens.

Further, as discussed above, it may be desirable to avoid matching the section size to the lens size that provides an even integer number of lenses in the set of lenses used to display each section of a color image as this can lead to banding. For example, if the lenses are round and have a 25 micron diameter, it may be useful to avoid sizing the sections in the ink layer at 100 microns (or other multiple of 25 microns) as this will result in 16 lenses in each square (or an even integer) and instead to choose a section size that is 90 microns or 110 microns or the like (a number not perfectly divisible by the lens diameter).

In this example, the first section/portion 502 of the security element 500 includes a set of four micro lenses 520 covering the set of red pixels 510 (pixels of the first color), and as can be seen with the lens 520 in the lower lefthand corner the data-containing (or colored) pixels 511 are arranged in a first pattern while other pixels 515 under this lens are free of color/ink or are data-empty (or absent) pixels. The second section/portion 504 of the security element 500 is the same size and shape and includes a set of four micro lenses 524 covering the set of blue pixels 512 (pixels of the second color). In other words, the lenses 520 are dedicated for focusing on pixels of a first color while the lenses 524 are dedicated for focusing on pixels of a second color. The sections 502, 504 are shown to be rectangular in shape (e.g., square) with sides having lengths of $d_x$ and $d_y$, and these dimensions for the sections 502, 504 typically are chosen to suit a particular printing process and its registration error/variance to limit overlap of the two printed sections (sets of pixels) 510, 512 (such as by limiting overlap to 30 percent or less overall (or 15 percent or less per side) to provide 70 percent or more clean pixels in the sets 510, 512).

As can be seen with the lens 524 in the lower lefthand corner of the section 504, the data-containing (or colored) pixels 514 are arranged in a second pattern differing from the first pattern used for the corresponding lens 520 of section 502 while other pixels 513 under this lens are free of color/ink or are data-empty pixels. Hence, when lenses 520, 524 are focusing on pixels of the first color (such as pixels 511) for the lenses 520 they are not concurrently focusing on pixels of the second color (e.g., not on pixels 514) but are focusing on data-empty pixels (such as pixels 513) for the lenses 524. Similarly, when lenses 520, 524 are focusing on pixels of the second color (such as pixels 514) for the lenses 524 they are not concurrently focusing on pixels of the first color (e.g., not on pixels 511) but are focusing on data-empty pixels (such as pixels 515) for the lenses 520. In this manner, the display of each set of differently colored pixels (and their associate images) is cleaner than in prior optical security elements as the colored pixels are generally not overlapping (or printed in the same location in the security element's ink layer).

Figure 6:
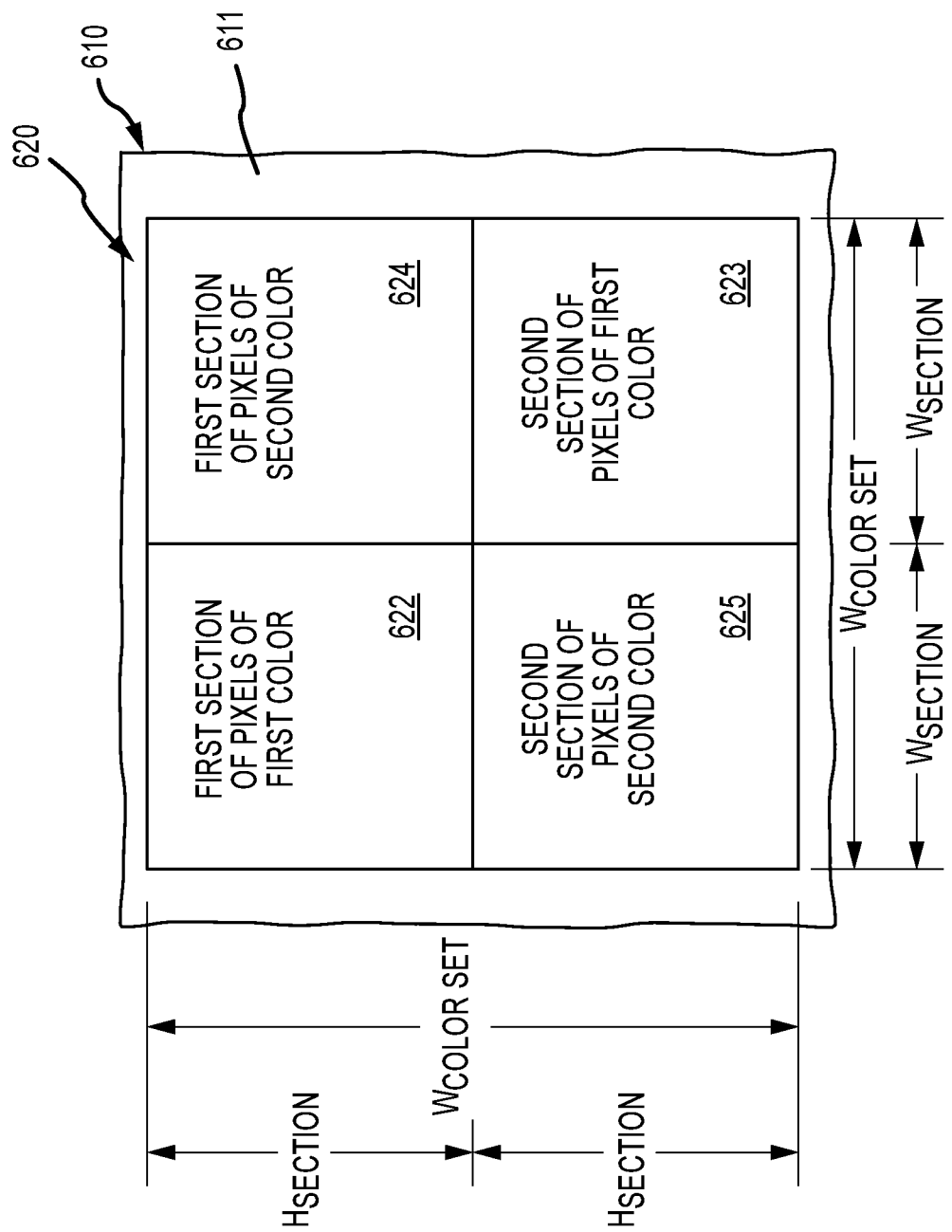
FIG. 6 illustrates a portion of an optical display assembly (or security element) showing a portion of a substrate/carrier film upon which an individual color set of an ink layer/printed image is provided.

FIG. 6 illustrates a portion of an optical display assembly (or security element) showing a portion of a substrate/carrier film 610. On a first surface/side 611 of the substrate/carrier film 610, an ink layer/printed image 620 is deposited or printed according to printing processes described herein. Particularly, the portion of the ink layer 620 shown may be considered one color set of the ink layer/printed image 620, and the optical security element/display assembly would typically include numerous other color sets arranged in a checkerboard/chessboard pattern by repeating the pattern shown in FIG. 6.

Specifically, the color set 620 is shown to include a first section of pixels 622 of a first color side-by-side or adjacent in a horizontal row with a first section of pixels 624 of a second color. Further, the color set 620 includes a second section of pixels 625 of the second color below (and adjacent to) in a vertical column with the first section of pixels 622 of the first color and yet further includes a second section of pixels 623 of the first color below (and adjacent to) in a vertical column with the first section of pixels 624 of the second color (or, in other words, the second or lower row is offset by one section from the first or upper row to achieve a checkerboard/chessboard arrangement). In this way, the color set 620 includes an equal number of sections for each color (assuming that only two colors are displayed but similar design principles apply to use of a larger number of colors) as well as an equal number of pixels for generating each of two colored images.

In this example, the sections are shown to be square in shape and have a height, $H_{Section}$, and a width, $W_{Section}$, and these dimensions when added together define, respectively the height, $H_{Color\ Set}$, of a color set of ink layer 620 and the width, $W_{Color\ Set}$, of the color set of the ink layer 620. Here, a color set is chosen to be a portion of rows and columns equal to the number of differing colors being displayed in the security element/display assembly (e.g., a 2 by 2 array of sections for two colors, a 3 by 3 array of sections for three colors, and so on). Generally, the size of the color set 620 (and each section) is chosen based on the registration error/variance of the printing device/process used in printing the ink layer of an optical security element. As a minimum, the color set's height, $H_{Color\ Set}$, and width, $W_{Color\ Set}$, are chosen to be greater than the registration error. More typically, these dimensions will be 2 to 20 times or more greater to give a large percentage (i.e., 70 percent or greater) of "clean" or non-overlapping pixels in each section. For example, the registration error may be 20 microns, and the color set may have dimensions of 200 microns, with each section having dimensions of 100 microns. This example provides more than 70 percent (such as about 80 percent or more) clean pixels even when the printing is towards its maximum registration error/variance (or plate movement).

Figure 7:
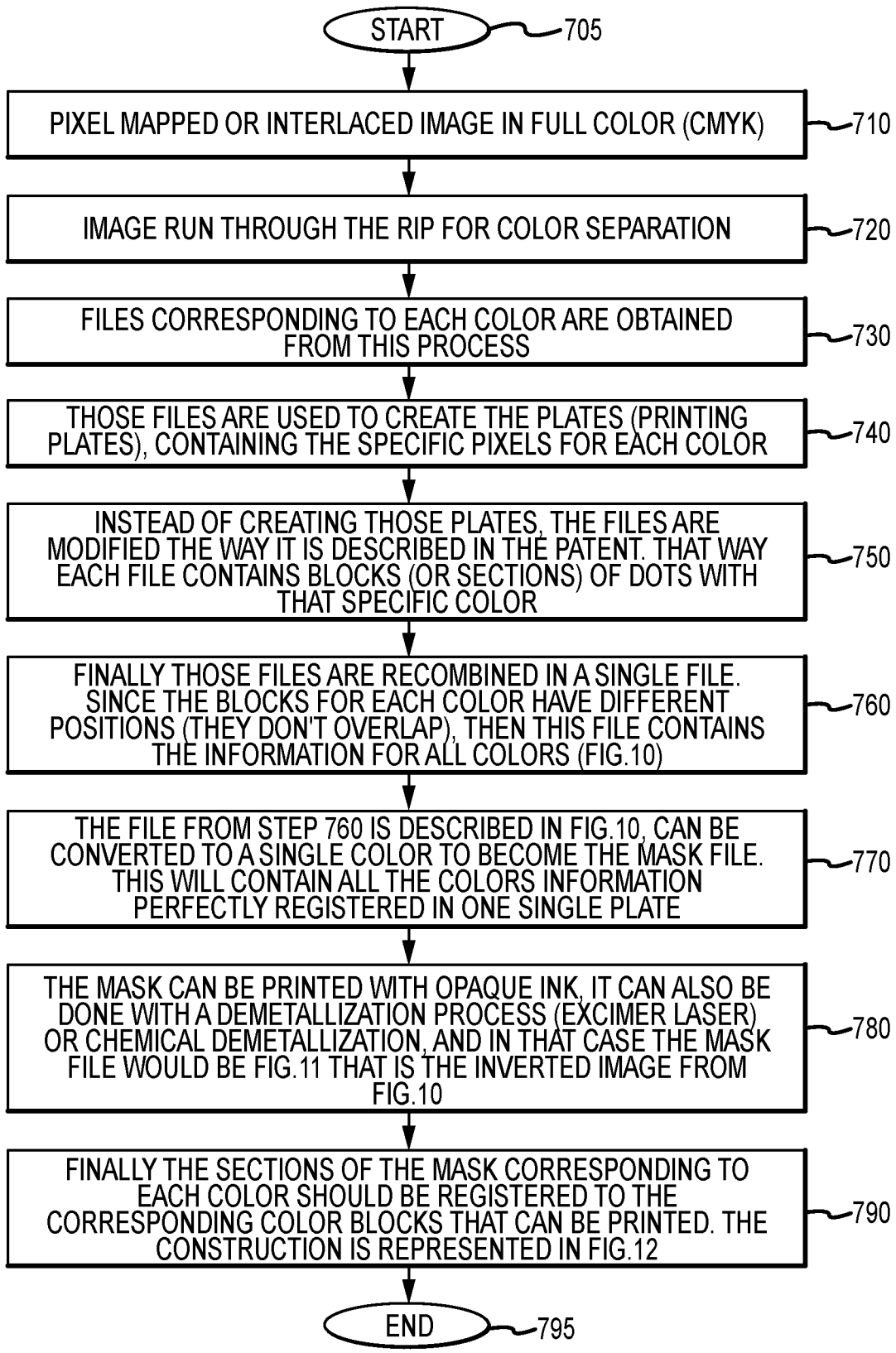
FIG. 7 illustrates a flow diagram for a printing method for use in fabricating lens-based display assemblies such as optical security elements.

FIG. 7 illustrates a flow diagram for a printing method 700 for use in fabricating lens-based display assemblies such as optical security elements using masks as discussed in more detail below. The method 700 starts at 705 such as with initiating a workstation or computer system for use in generating a print file for printing an ink layer with blocks of each color positioned in sections/areas that are paired with lenses dedicated to focusing on that particular color. This may involve providing a print file generator (e.g. a software suite or set of programs) on the workstation, and this print file generator is configured for performing the processing functions described herein on a digital interlaced image file to create a print file for controlling a printer/print system.

The method 700 continues at 710 with forming or retrieving/accessing a pixel mapped or interlaced image in full color (CMYK). Then, at 720, the method 700 continues with running this image through the RIP for color separation. At 730, the method 700 involves obtaining and saving filed corresponding to each color from the process of step 720. In step 740, the method 700 continues with using the files from step 730 to create the plates (e.g., printing plates) that contain the specific pixels for each color.

Then, at 750, instead of creating those plates, the files (of plate files or file plates) are modified as described herein such that each file contains blocks (or sections) of dots with that specific color. In step 760, the method 700 continues with recombining the files modified in step 750 into a single file. Since the block for each color have different positions (i.e., they typically do not overlap), this new combination file contains the information for all colors (e.g., see FIG. 10). The method 700 continues at 770 with the converting the file from step 760 to a single color to become the mask file (or mask print or fabrication file). This mask file contains all the color information, which is perfectly registered in one single plate.

Figure 10:
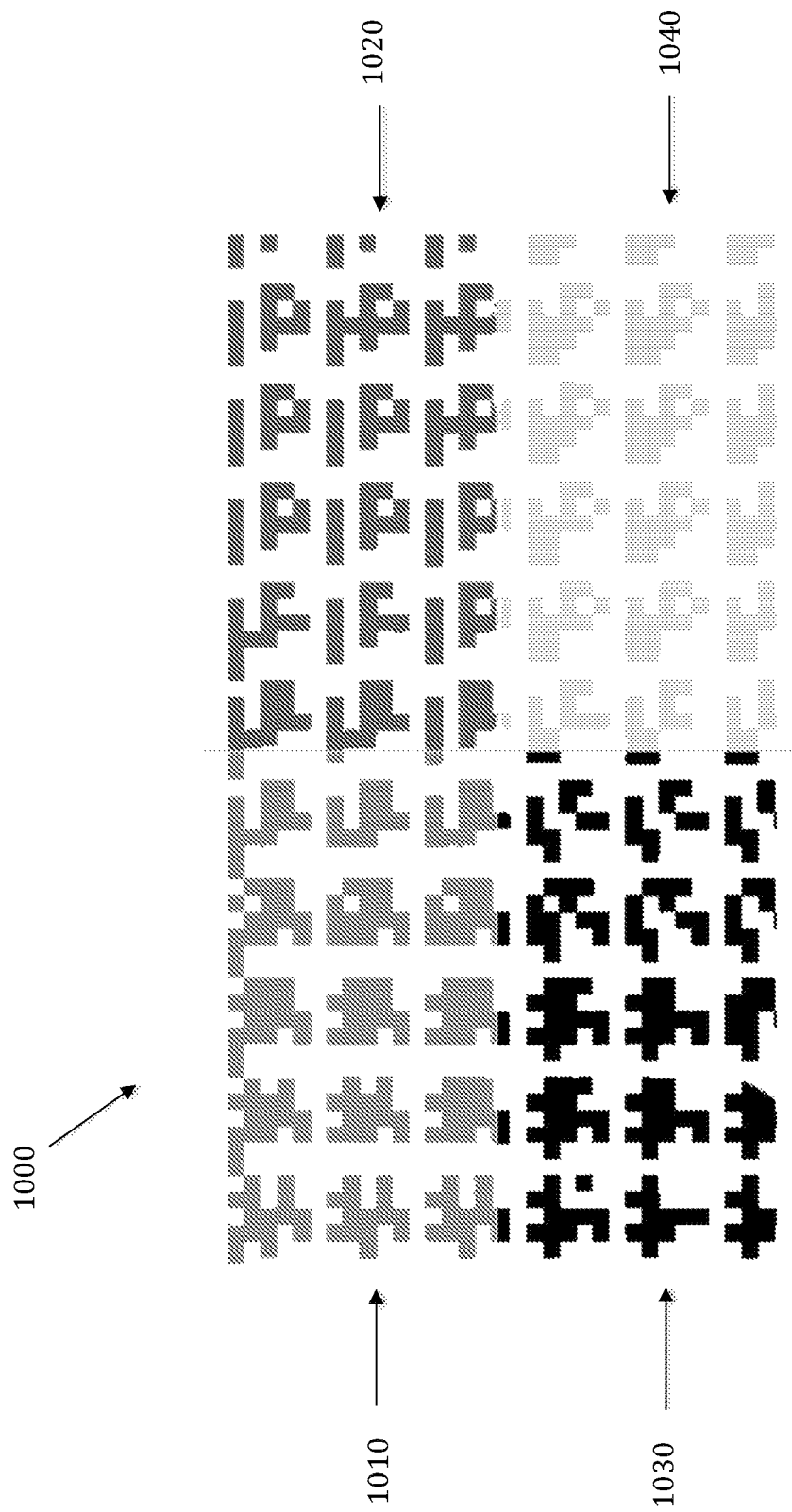
FIG. 10 illustrates a portion of a printed image/ink layer with a pattern of dots or blocks that may be used during printing to provide four differently colored pixels.
Figure 11:
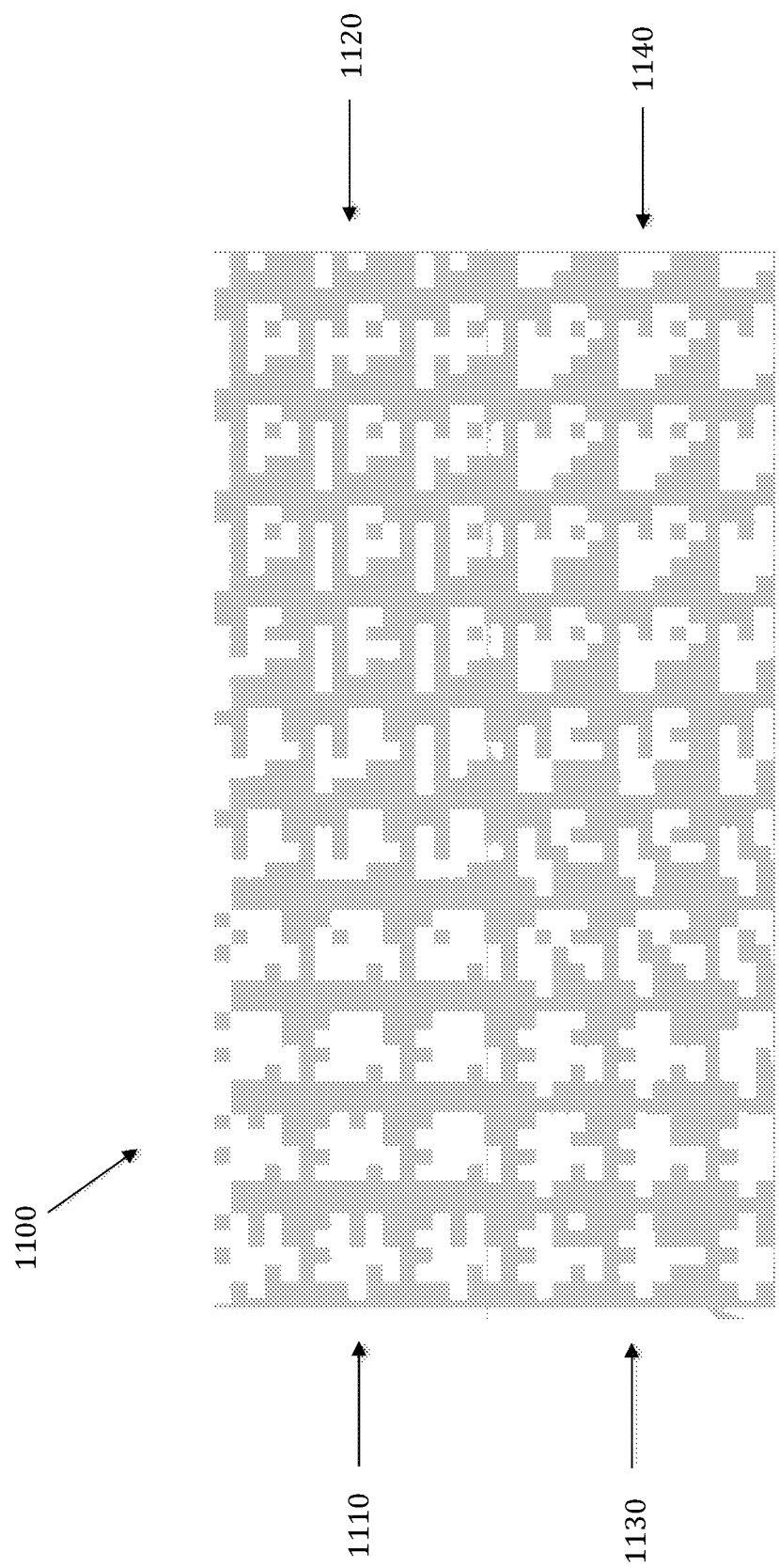
FIG. 11 illustrates a portion of a digital mask file or mask image that may be created from the portion of the printed image/ink layer shown in FIG. 10 and used to form a mask for inclusion in an optical display assembly between the printed image/ink layer to address registration issues during printing.

Then, in step 780, the fabrication method 700 continues with forming the mask based on the mask file from step 770. Step 780 may involve printing the mask onto a substrate (or back side of a lens array or a substrate including the lens arrays on the opposite side) with opaque ink. The mask may be formed in step 780 using a de-metallization process (such as with a laser, e.g., an excimer laser or the like or such as with chemical de-metallization), and, in such cases, the mask file would be as shown in FIG. 11, which is the inverted image from FIG. 10. In step 790, the color blocks (or ink layer) may be printed onto the mask because the sections of the mask corresponding to each color are registered to corresponding color blocks. The construction performed in the method 700 is shown by way of example in FIG. 12. The method 700 may then end at step 795.

Figure 8:
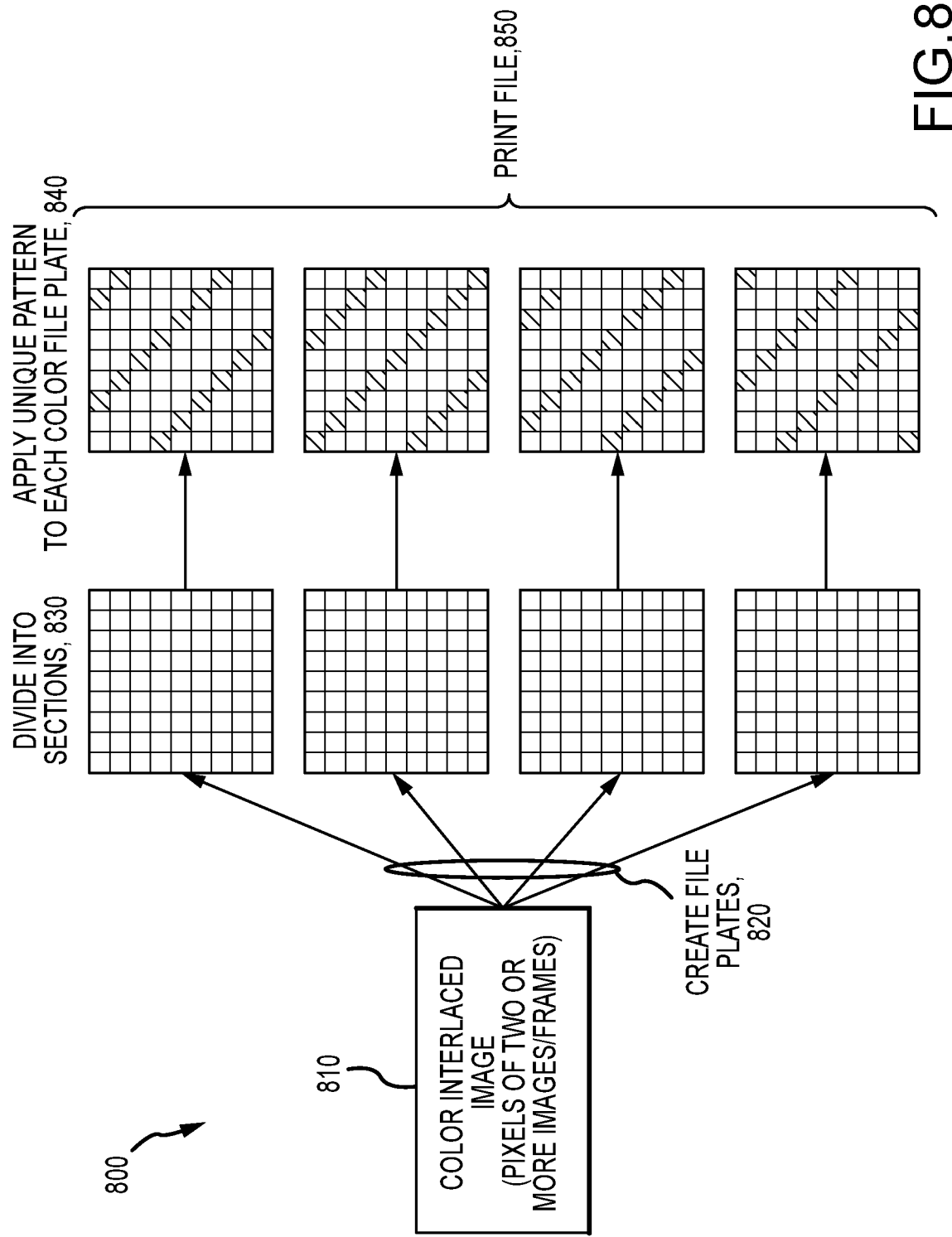
FIG. 8 illustrates schematically steps in creating a print file for use in printing pixels of different colors under different sets of lens of a lens array (e.g., under a sheet/layer of round or other shaped micro lenses)

FIG. 8 illustrates schematically steps in a process 800 of creating a print file for use in printing pixels of different colors under different sets of lens of a lens array (e.g., under a sheet/layer of round or other shaped micro lenses). At 810, a color interlaced image 810 is retrieved or accessed in memory, and the interlaced image includes pixels corresponding with two or more images/frames. At 820, color separation is performed to create from the interlaced image two or more plates (with four shown such as a C plate, a M plate, a Y plate, and a K plate for a CMYK printing process or the like) that include all the pixels of each individual color arranged in a pattern that is useful for creating a color display (of a color image or two or more color images with or without visual effects defined by the interlacing technique used to create the interlaced image 810).

At 830, each of the color plates is divided (such as with a grid pattern of rows and columns) into a plurality of sections/boxes (of pixels), with the same dividing process used on each plate such that there is an equal number of sections/boxes in each gridded/divided plate (and with the sections/boxes having the same shape, size, and locations). Then, at 840, a unique pattern is applied to each gridded/divided color plate (e.g., a pattern associated with each color) to identify a subset of the sections/boxes in each color plate 830 to be used in printing a print image/ink layer. As discussed above, it is desirable to have an equal number of sections/boxes chosen in step 840 for each of the plates and for these to be spaced apart relatively equally to produce a quality color imagery with the optical security element/lens-based display assembly. A print file 850 is then generated with the set of color plates from step 840 that can be used by a print controller to operate a printer/print system to apply the two or more colors in an ink layer/printed image on a substrate or upon the back of the lens array (see, for example, FIG. 10).

Figure 9:
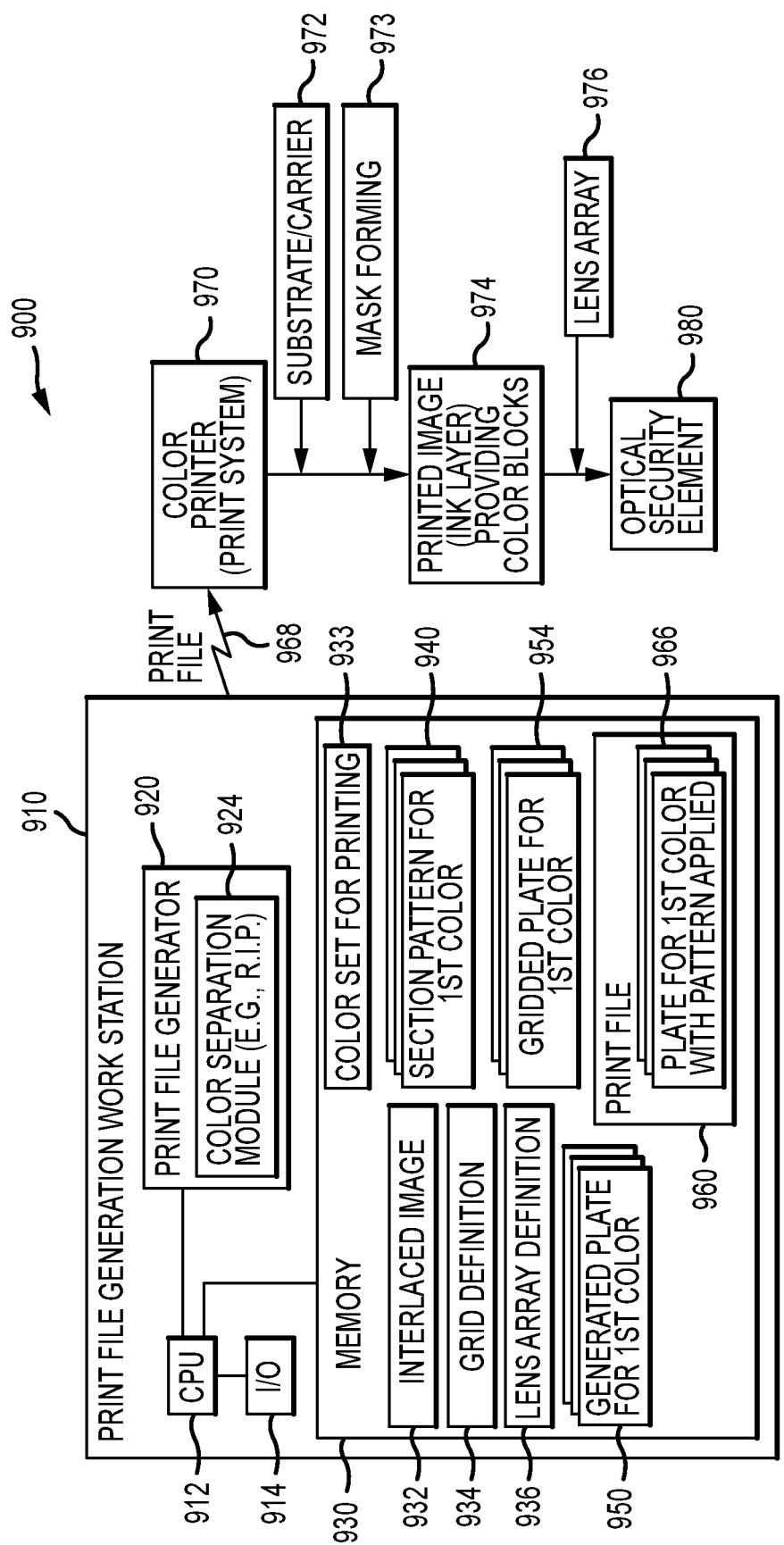
FIG. 9 is a functional block diagram of a print system operable to create a print file according to the present description and create an optical security element (or other lens-based display assembly)

FIG. 9 is a functional block diagram of a print system 900 operable to create a print file 960 according to the present description and create an optical security element (or other lens-based display assembly) 980. The system 900 includes a print file generation workstation 910 that includes a processor(s) 912 for executing code/instructions (or software) to provide the functionality of a print file generator 920. The workstation or computer 910 also includes input/output device 914 managed by the CPU 912 (and an operating system run on the workstation 910) to allow a user to provide input and view output and work in progress. The workstation 910 also includes memory or data storage 930 used to store digital information/data/files useful by the print file generator 920 and generated by the print file generator 920, and the data storage and retrieval from the memory 930 is controlled by the processor 912.

As shown, the memory 930 is shown to include an interlaced image 932, which is a digital file defining the interlacing of two or more color images/frames for display with a lens array 976. The memory 930 also includes a lens array definition 936 that defines values for design parameters of the lens array 976 such as lens shape, lens size, lens density/frequency, and the like. The memory also includes a grid definition 934 defining section/box dimensions for use by the print file generator 920 in creating a print file 960. Also stored in the memory 930, a color set for printing 938 is stored, and this may be default or set based on user input via I/O devices 914 and indicates which two or more colors are to be printed in the printed image/ink layer 974 by the printer 970 (e.g., all colors, first and second colors, first, second and third colors, and so on). The sizes of the sections/boxes of pixels defined is useful for matching the sections to sets of lenses in the lens array 976 (and this may be non-integer numbers of lenses for each section/box as discussed above). Additionally, the memory 930 includes a section pattern for each color 940 that defines which sections/boxes for each color plate are to be used in the printing process.

During operations, the print file generator 920 accesses or retrieves the interlaced image 932, and the generator 920 uses a color separation module (e.g., an RIP or the like) to create a plate 950 for each color in the printing color set 938. Generally, there will be at least two plates 950 with three or four being common for many optical security elements 980. The print file generator 920 than processes each of the generated plates 950 based on the grid definition 934 to divide each plate into a plurality of sections/boxes to provide gridded plates for each color as shown at 954. The print file generator 920 then functions to process each of these gridded plates 954 with the section pattern 940 for each particular color so as to generate a plate for each color with the pattern applied to define which sections/boxes are to be used in printing 966 as shown at 966. The combination of these color plates that have been gridded/divided into sections and that have been patterned to define printing subsets of sections is stored in memory as shown at 966 and used to create a print file 960.

Then, printing may proceed, with the workstation 910 providing a copy of the print file 963 to a color digital printer/print system 970 (or its print controller). The printer 970 uses the print file 968 to print each color of ink defined in the color set 938 based on each plate 966 on a substrate/carrier film 972 (or directly on the lens array 976) so as to form the printed image/ink layer 974. The printer may be configured to provide the printing on the lens array or substrate surface using offset printing, flexography, gravure, or digital printing. There is some overlapping of the pixels of differing colors due to registration error/variance/tolerances of the printer 970, but it will be significantly less than with prior printing techniques that printed every color under every lens. For example, 70 percent or more of the area (and pixels) of each section/box that is printed to provide the printed image/ink layer 974 may be "clean" or non-overlapping (e.g., only one color in a particular location). The optical security element or lens-based display assembly 980 is then formed by mating the lens array 976 with the printed image 974 and substrate 972 (when the ink layer 974 is not printed directly onto the lens array 976—in which case, the substrate if used may be applied to the lens array 976) so that each printed section/box of colored pixels is positioned under sets of lenses dedicated to focusing on that particular color. As shown at 973, a mask may be formed on the substrate/carrier such as prior to the forming of the printed image 974 when the print file defines a checkerboard of color blocks (as discussed in more detail below) that are aligned/registered with portions of the mask 973 to align color pixels with lenses for proper display of an image with the formed optical security element 980.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed. For example, the printing techniques discussed herein are useful with a wide variety of lenses including micro lenses with a focal length less than $^{10}/_{1000}$ inches.

With the above methods and optical display features understood, it may be useful to further describe the use of RIP software that is modified to provide the functionality taught herein and to further explain use of a mask with the printed color blocks/dots to provide improved visual effects. A raster image processor (RIP) is a component (software and/or firmware) used in a printing system which produces a raster image also known as a bitmap. Such a bitmap is used by a later stage of the printing system to produce the printed output. Digital half-toning refers to the process of converting a continuous-tone image or photograph into a pattern of black and white picture elements for reproduction by a binary display device such as an ink jet printer, which can only choose to print or not print dots. In these digital printers, the half-toning process of projecting a continuous-tone original through a halftone screen has been replaced with a raster image processor (RIP) that converts each pixel of the original image from an intermediate tone directly into a binary dot based upon a pixel-by-pixel comparison of the original image with an array of thresholds. Pixels of the original with intensities greater than their corresponding threshold are turned "on" (printed) in the final half-toned image while pixels less than their corresponding thresholds are turned "off." From a full color picture of a face for example, the RIP will convert each of the original pixels into binary C, M, Y, or K pixels that can be printed by the device. It is also important to notice that any shade or color will be accomplished by the right combination and percentages of binary dots C, M, Y or K.

For a lens based image it is impossible to register the four color process dots under each lens. In a first alternative, the registration is performed as discussed above. However, some preferred embodiments use a second alternative to perform registration. It is possible to work with sections of colors just like the diagrams and obtain a perfect color and image flip like this example (of FIGS. 4A and 4B). In this registration process, a section or group of lenses contains information (pixels) from one image and first color, and another section or group of lenses contains the information from the second image and second color. In this case shown in FIGS. 4A and 4B, both images (bird and dog in this example) are simple shapes and each one was chosen to have solid color (no shades or tones in this example).

As a more sophisticated alternative, an actual full color picture of a dog and a bird may be used, but the registration requirements may be difficult to nearly impossible for a lens feature. The inventors recognized and generated one useful solution. First, the fabrication process involves using a pixel mapping system for the full color frames (or original images) to create an interlaced image in full color. Second, the image is run through RIP software to generate a pixel mapped or interlaced image in a binary fashion containing only C, M, Y, and K dots. Usually this is the image that is printed, but, in this case, the registration requirements for a micro lens makes this impossible or at least very difficult. Third, the rasterized image (or each of the C, M, Y, and K files containing the corresponding dots from the interlaced image) is taken and used to create sections of colors in a chessboard like configuration and selecting only the corresponding dots to each section. The sections that are selected for cyan will only contain the cyan dots and all the other colors are deleted from that section, with similar processing for all the other sections. This way the interlaced image will look like the image 1000 in FIG. 10. For simplicity, this example image 1000 is shown with just four sections 1010, 1020, 1030, and 1040, (e.g., one for each color). The idea is to print this image, but even these macro sections of color 1010, 1020, 1030, and 1040 may present challenges for registration.

However, the inventors recognized that it may be useful to generate a digital mask file as shown at 1100 in FIG. 11 with the four sections 1110, 1120, 1130, and 1140. The digital mask file 1100 can be created from the image 1000, with the sections 1110, 1120, 1130, and 1140 corresponding with sections 1010, 1020, 1030, and 1040 but containing the absence of color (or blank spaces where color dots/pixels are in image 1000). This image 1100 is the "inverted" image from all the colors that contains the perfect registration and interlaced information for each group of colors 1010, 1020, 1030, and 1040.

A mask may be generated or fabricated from the file/mask image 1100 for inclusion in an optical display assembly or feature described herein, and this mask would be positioned between the ink layer/color dots or blocks and the lens array. The mask may be formed as a trough(s) via a demetallization process, may be generated using excimer laser ablation, or may be formed using some other opaque mask system that can be registered with printed blocks of color. An advantage to the use of the mask is that each of the printed blocks of color can have some room for unregistration or overprinting, but the "mask" will provide the image back to the viewer in perfect registration. In this case, the blocks or dots or pixels of color can be printed directly on the back of the mask or they can be printed on the banknote/substrate, and the mask with the lenses applied on top. Each of the color sections 1010, 1020, 1030, and 1040 has the right percentage of color dots to create any color or shade because they come from the image processed by the RIP software/firmware such that the viewer will see a full color image through the lenses with the corresponding effect or animation.

In some preferred implementations, the ink layer or printed image is a checkboard pattern of colored blocks rather than a printing of the pixels/color data from the interlaced image and color plates. In these embodiments, a solid color block (e.g., a cyan block, a magenta block, a yellow block, or a black block in a CMYK implementation) is provided in the ink layer/printed image, and the mask is configured to allow the color to be seen underneath each set of lenses (which are dedicated to a particular color) at the pixels and/or with the desired percentages to create the colored interlaced image. As discussed above, the mask is also configured to be blank or block colors under sets of lenses that are not designated to focus on that color.

The optical display assembly, which may be used as a security element for example, may be used with a transparent substrate (e.g., polymer currency or the like) or with a paper (or opaque) substrate (e.g., for paper currency, on a product label, on a front side of a financial card or identification document, or the like). For example, the bank note 100 of FIG. 2 may be implemented with a carrier film or transparent substrate 144 (e.g., 80 micron-thick polymer sheet or the like) and a lens array 141 of linear or micro lenses (e.g., 60 micron lenses with a thickness of 92 microns or the like) 142. The image element 148 in the color block embodiment would include a mask (as designed according to the description below for example) on or against the surface 114 of the substrate 144 and with an ink layer/printed image printed on the opposite side of the mask (e.g., with the mask sandwiched between the ink layer and the substrate surface 114), and this ink layer/printed image would have a checkerboard pattern of colored blocks that are aligned with and printed under sets of the lenses 142 that are chosen to focus on that particular color.

Figure 12:
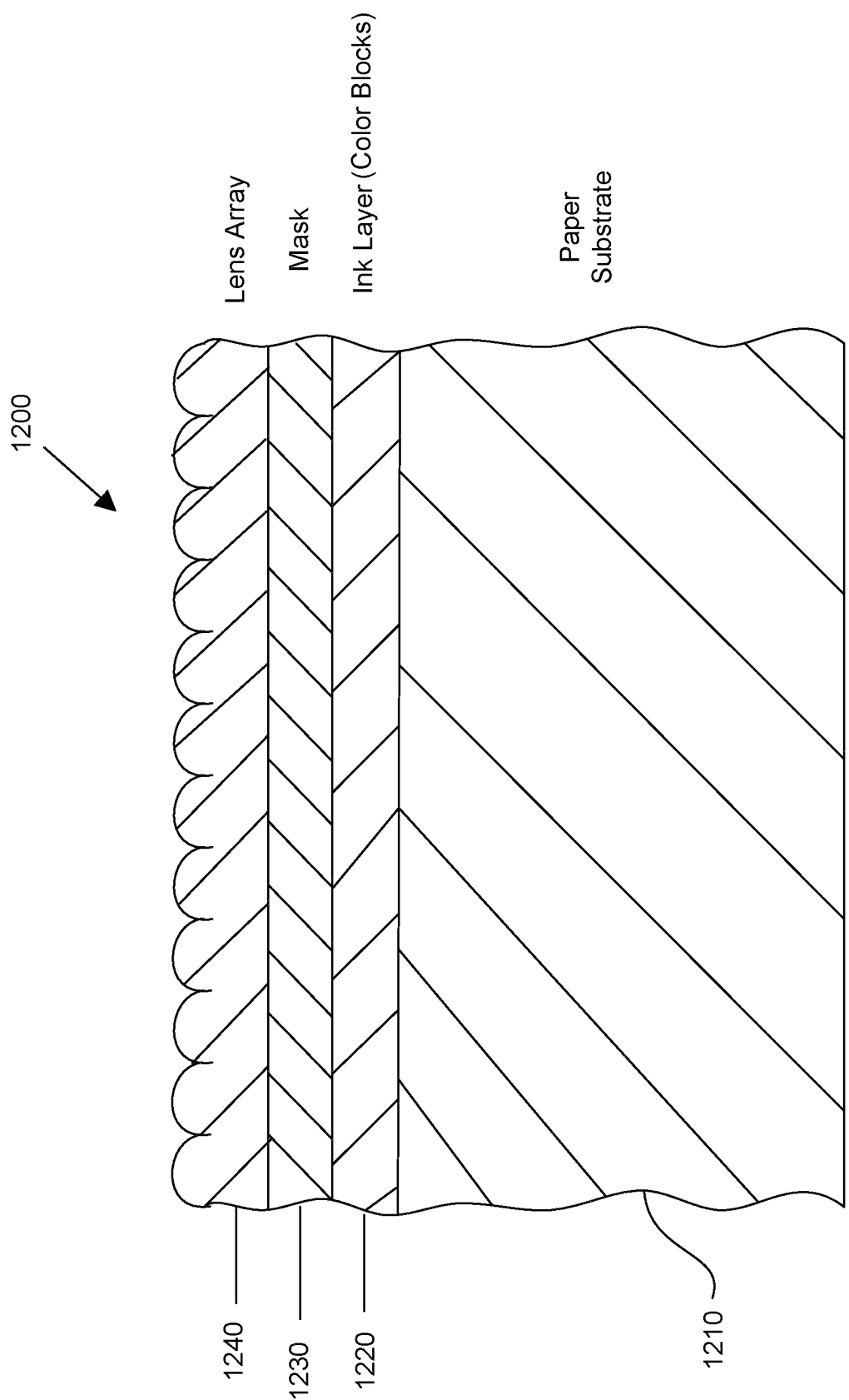
FIG. 12 is a sectional side view of a product of the present description including a paper/opaque substrate and an optical display assembly that includes a mask and an ink layer including a plurality of color blocks in a checkboard pattern.

FIG. 12 illustrates a paper (or other opaque material) substrate implementation of a product (such as paper currency) 1200 with a lens-based display apparatus or assembly (e.g., the upper three layers of the product 1200). The product 1200 includes a paper (or other opaque/translucent material) substrate or sheet/film 1210. An ink layer/printed image 1220 is provided on a side or surface of the substrate 1210, and the ink layer/printed image 1220 includes a plurality of colored blocks (two or more colors) arranged in a checkboard manner to be underneath sets of lenses in a lens array 1240 (e.g., a sheet of micro lenses (e.g., 20 micron lenses or the like) with an array thickness of 22 microns thick (or other useful thickness)). Further, a mask 1230 is provided in the product 1200 so as to be sandwiched between or interposed between the ink layer 1220 and the lens array 1240, with the mask 1230 on or against the planar back side/surface of the lens array 1240. In practice, the mask 1230 may be formed on the planar back surface of the lens array 1240 and the ink layer 1220 printed upon the opposite side of the mask 1230, and this optical display assembly may be attached to the side/surface of the substrate 1210. In other cases, though, the ink layer 1220 may be formed on the paper substrate 1210, the mask 1230 may be formed on the lens array 1240, and the mask/lens array combination may be applied to the substrate 1210 to abut the previously applied ink layer 1220.

At this point in the description, it may be useful to describe a method of generating a mask and an ink layer/print image for an optical display assembly that utilizes color (or colored) blocks combined with a mask to present lens-based imagery with two or more colors. As will be understood from the prior discussion, each color block is printed in a pattern (checkboard or the like) such that its colored blocks are aligned with sets of lenses in a lens array chosen for focusing on the particular color of each of these blocks, and a mask is used to define for a particular image the dots or pixels of each image/frame of an interlaced image that are displayed via the lenses.

Figure 13:
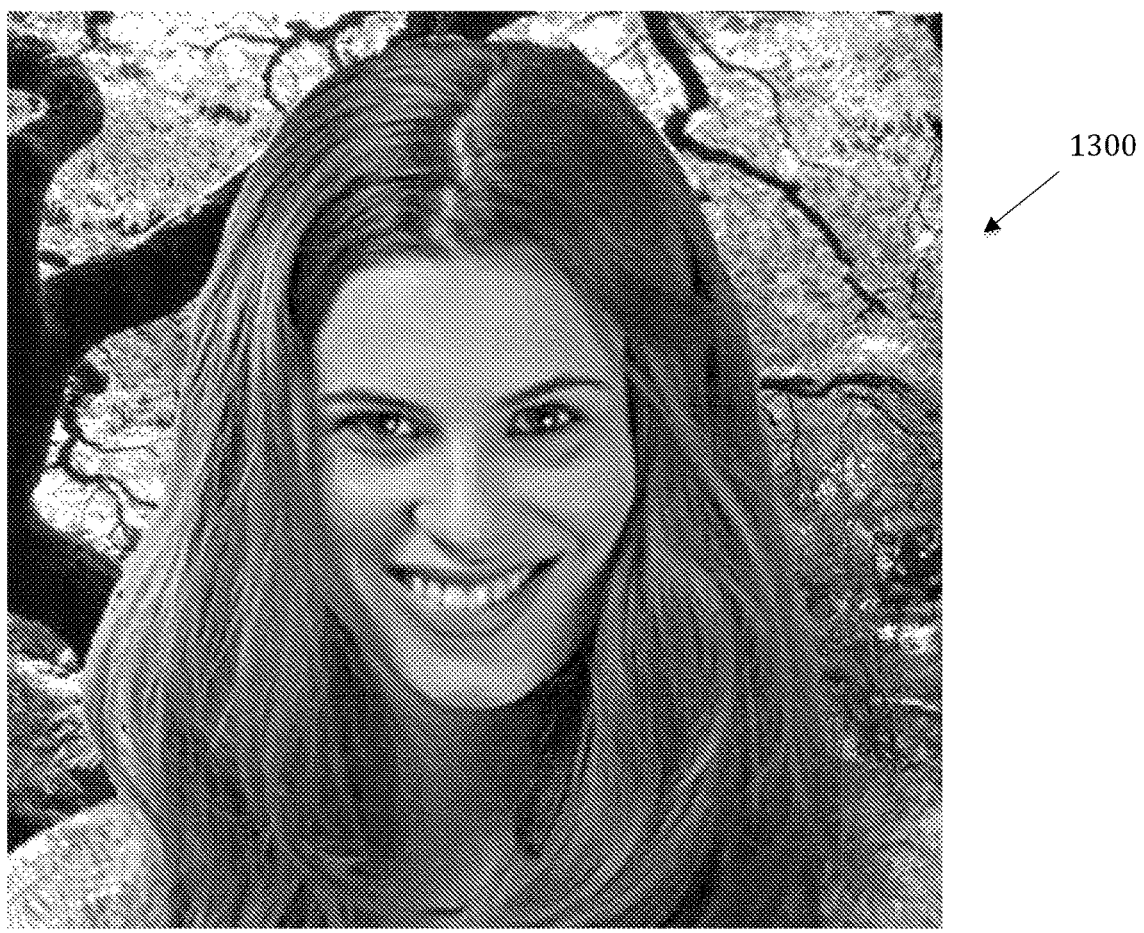
FIG. 13 shows image of one image out of a set of frames of a sequence used to form a full color interlaced image.

The method begins with choosing (or accessing from memory) a sequence or matrix of frames (digital images) that typically will have images that are of two or more colors with full color sequences of frames used in many embodiments. FIG. 13 illustrates an image 1300 of one such frame out of an exemplary sequence of frames (e.g., full color using CYMK or the like). The frame sequence is interlaced using a pixel mapping system or software to match or achieve the desired effect and to suit the lens array. The method continues with processing the interlaced image with a color separation module (e.g., an RIP or the like) to create or provide color separation for the digital interlaced image. The output of the RIP/color separation module may be four files, i.e., one plate or file for each color (C, M, Y, and K), but, to simplify explanation, all four files are presented in one file. Particularly, FIG. 14 illustrates an image 1400 that is a preview or representation of that single color separated file provided by the RIP.

Figure 15:
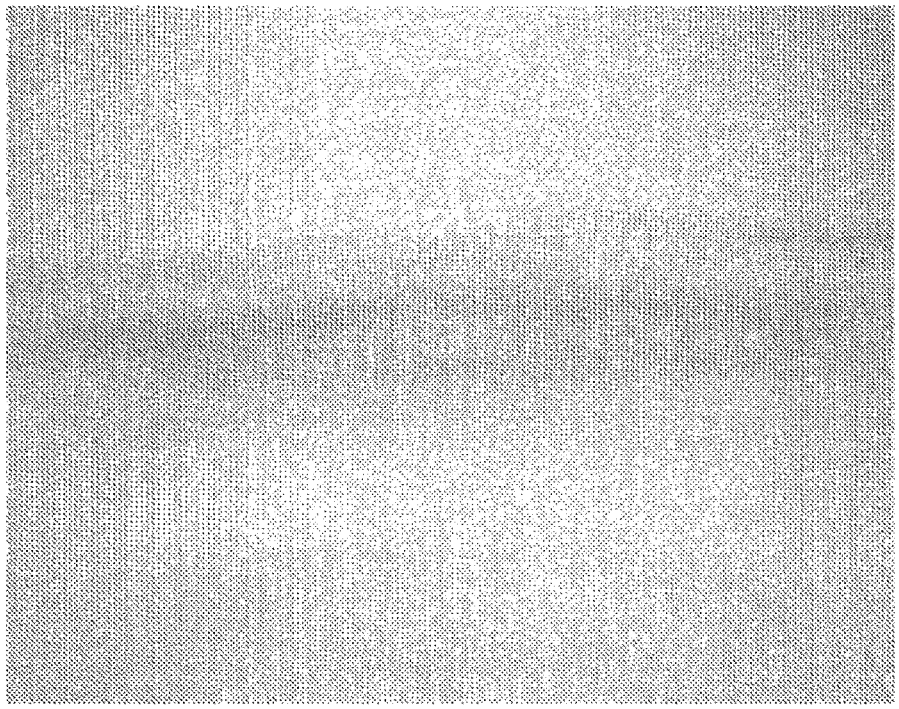
FIG. 15 illustrates an enlarged or "zoomed in" portion of the image of FIG. 14 (e.g., a portion near the eyes of the person in the color image)
Figure 16:
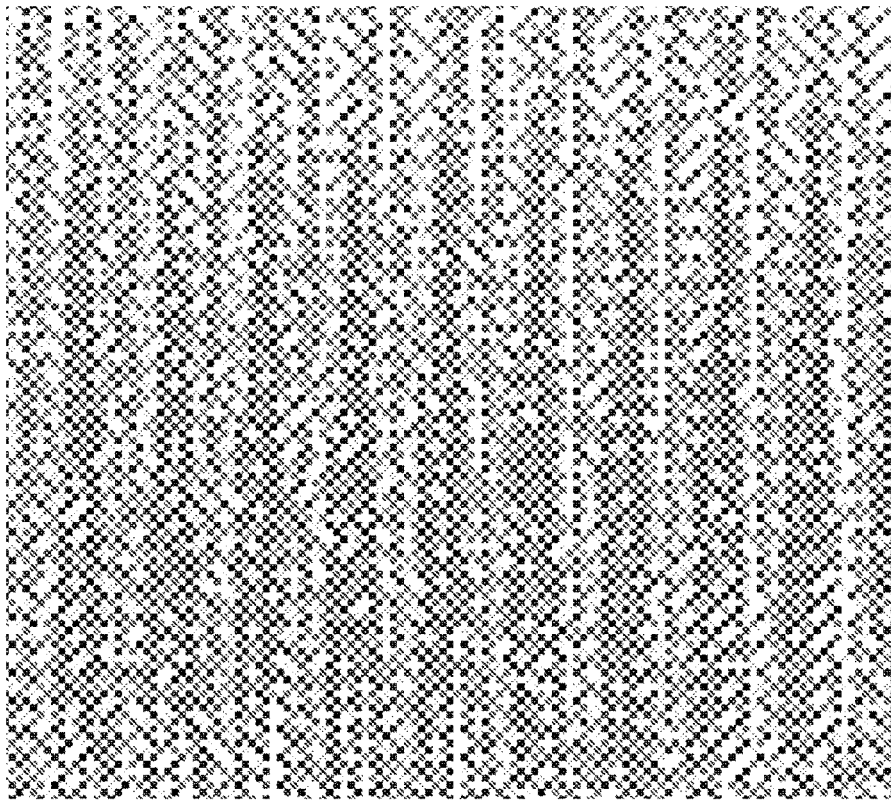
FIG. 16 illustrates a further enlargement or zoomed-in portion of the image of FIG. 15 showing the individual color pixels or dots in the digital file of the image that can be used in printing the image of FIG. 13.
Figure 17:
FIGS. 17-20 illustrate images generated as part of performing the color separation of the image of FIGS. 13-16 into four colored (C, Y, M, and K) plates for printing.
Figure 18:
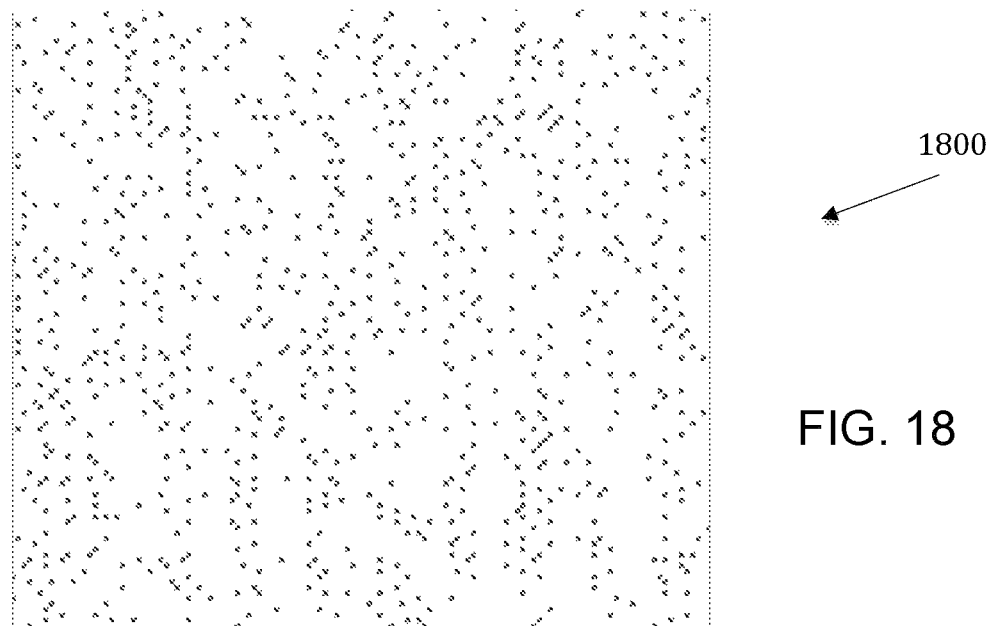
Figure 19:
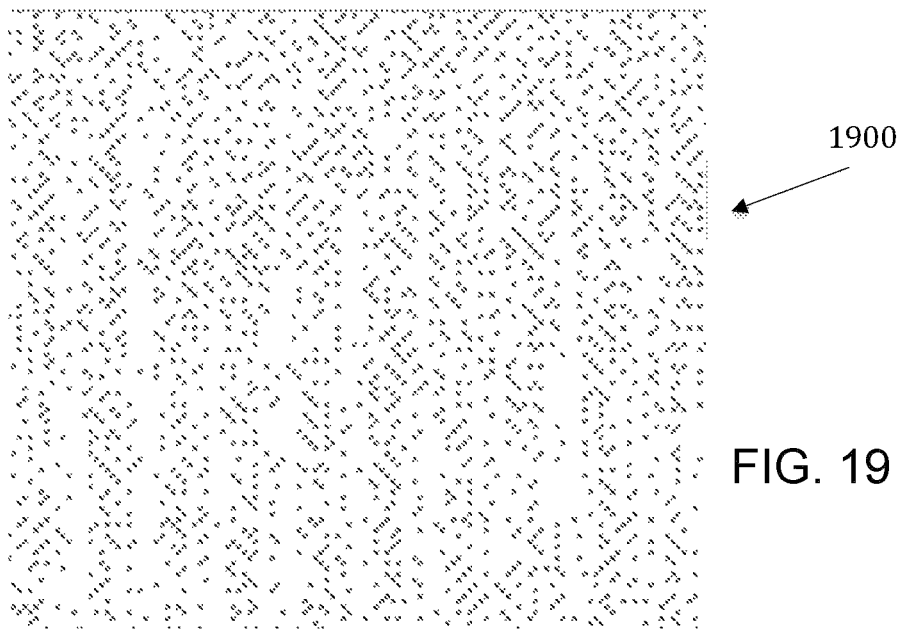
Figure 20:
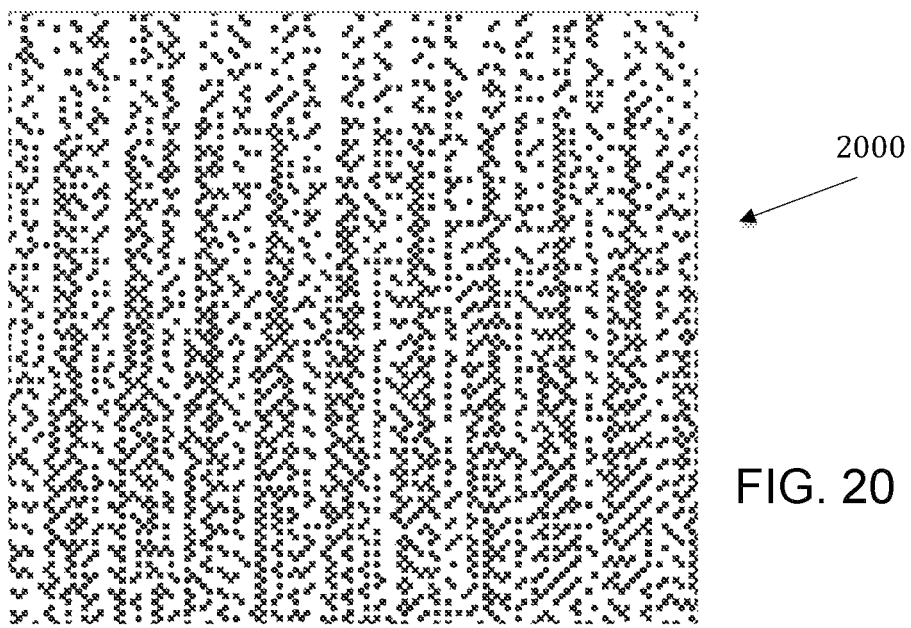
Figure 21:
FIGS. 21-24 illustrate new files/images generated from the images/files of FIGS. 17-20 selecting unique sections/blocks of color pixels (each in an offset checkboard pattern in this example) from each color plate.
Figure 22:
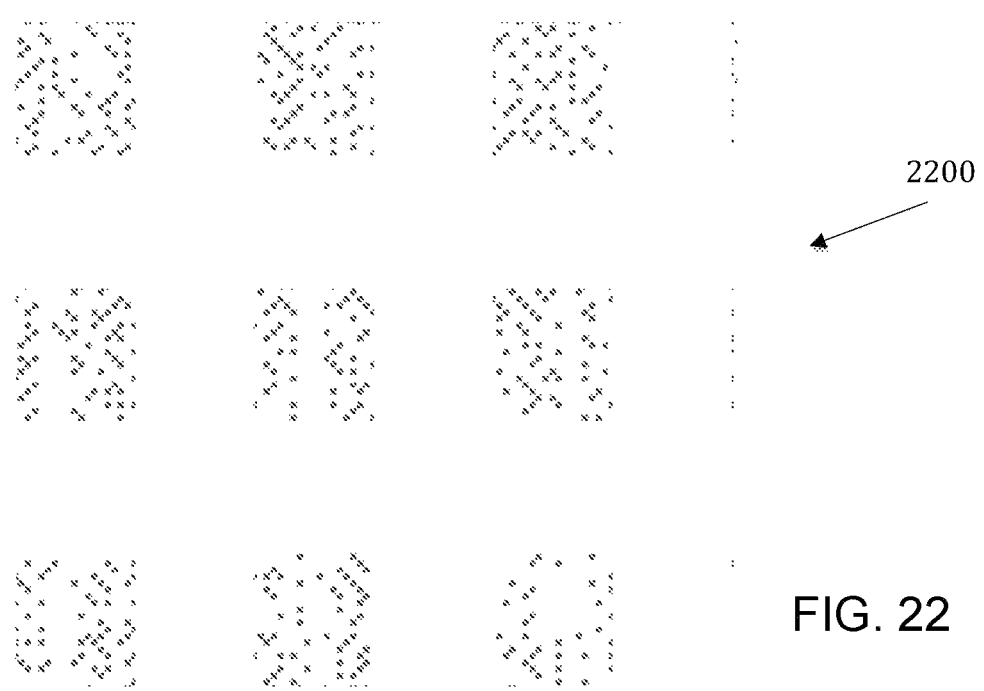
Figure 23:
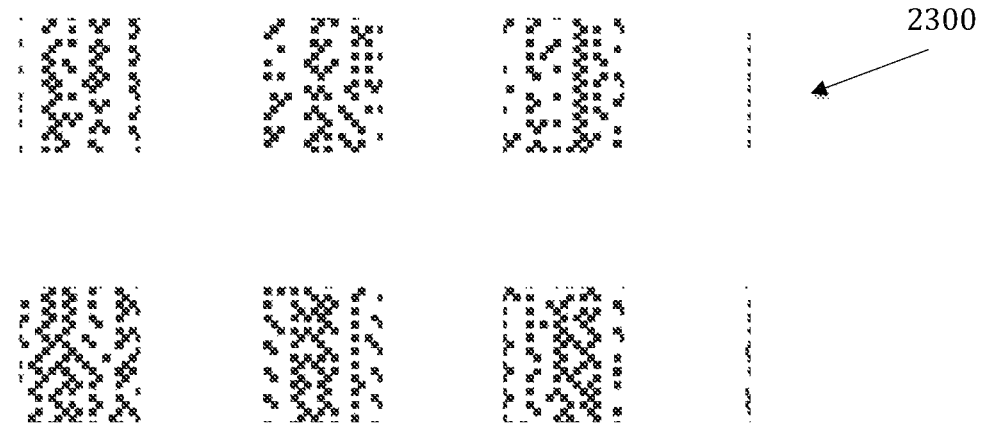
Figure 24:
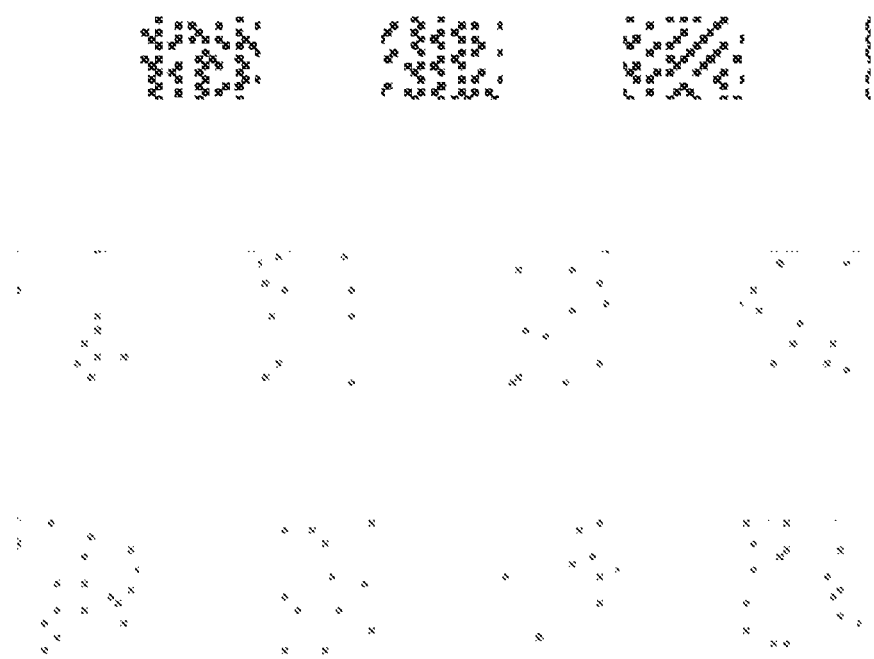

FIG. 15 illustrates an image 1500 that is an enlarged or "zoomed-in" representation of a specific section of the image 1400 (the eyes of the person's face chosen in this example). Further enlargement (or zooming in) on the image 1500 provides the image 1600 of FIG. 16 showing a plurality of dots (or also called pixels herein) of each color from each plate or file output by the RIP/color separation module. Although difficult to see in the black and white FIG. 16, the dots are colored dots such as C, M, Y, and K dots, and the file/image 1600 includes C, M, Y, and K dots (and blank white spaces between the dots) in the correct percentage and locations in the file 1600 to create the different colors from the original images to display the image 1300 when printed under a lens array. The image/file 1600 can be printed with traditional print methods using a plate for each color.

Figure 14:
FIG. 14 provides a representation of the image of FIG. 13 during color separation (e.g., by an RIP or the like)

In the method, the next step may be to complete color separation of the image 1400 of FIG. 14 to obtain a plate or file for each of the four colors. FIGS. 17-20 illustrate, respectively, a first color (cyan or the like) file or plate 1700, a second color (yellow or the like) file or plate 1800, a third color (magenta or the like) file or plate 1900, and a fourth color (black/K or the like) file or plate 2000. Each of the plates 1700, 1800, 1900, and 2000 contains dots for each color of the original interlaced image (along with blank spaces where no color would be printed/displayed). Note, each of FIGS. 17-20 is only a small portion of each file that is largely magnified to allow the viewer to see the dots as a typical file would include a significantly larger number of smaller dots (micron-sized dots/pixels). Each file 1700, 1800, 1900, and 2000 has different percentages or numbers of dots in unique locations that when combined generate all the needed color to display the original image (e.g., full (or at least two) color image 1300 of frame shown in FIG. 13 or the like).

The method of generating a file for a mask and an ink layer/image may then continue with the new software described herein (e.g., the print file generator 920 of FIG. 9) acting to select subsets or sections of the dots/pixels in each color plate 1700, 1800, 1900, and 2000 for use in fabricating an optical display assembly. FIGS. 21-24 illustrate with images 2100, 2200, 2300, and 2400 the set of sections/blocks of exemplary dots/pixels selected from the plates 1700, 1800, 1900, and 2000, respectively. As discussed above, each of these sections or blocks is chosen such that when the four sets of sections/blocks are combined each has its own unique location in a checkerboard-type pattern, and each section/block can be registered to a set of lenses in the lens array (or assigned to the set of lenses for focusing on a particular color).

Figure 25:
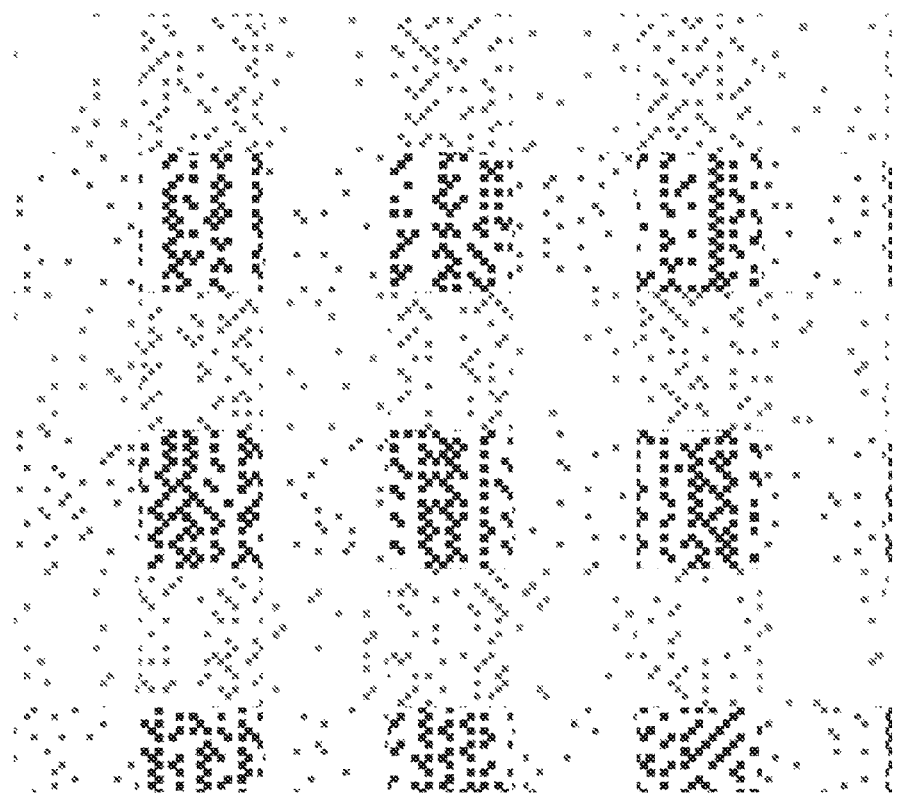
FIG. 25 illustrates a file/image formed by combining the files/images of FIGS. 21-24.

In contrast to the method described above where each of these plates is used in color printing, the color block process/method continues as shown with image 2500 of FIG. 25 with combining the images/files 2100, 2200, 2300, and 2400. Image/file 2500 is a file with the subset of dots/pixels of all four colors in a single file, and each of the blocks/sections of colored dots is in different location/position with a repeating checkboard pattern (e.g., each color set of blocks includes (starting from an upper left corner and continuing on to a lower right corner) a cyan block/section of dots, a magenta block/section of dots, a yellow block of dots, and a black section/block of dots, and such color sets are repeated in each row and column in the pattern of image 2500). Other patterns and arrangements may be used with a goal being to provide equal numbers of dots for each color that are relatively equally spaced about the image 2500 (with equal numbers being assumed by choosing equal sizes for the sections/blocks of each color and equal numbers of sections/blocks for each color in image/file 2500). Each section for each color corresponds to multiple lenses (or a set of lenses from the lens array), which can vary in size/number such 20 lens by 20 lens, 40 lens by 50 lens, or the like or an non-integer number of lenses as discussed above.

Figure 26:
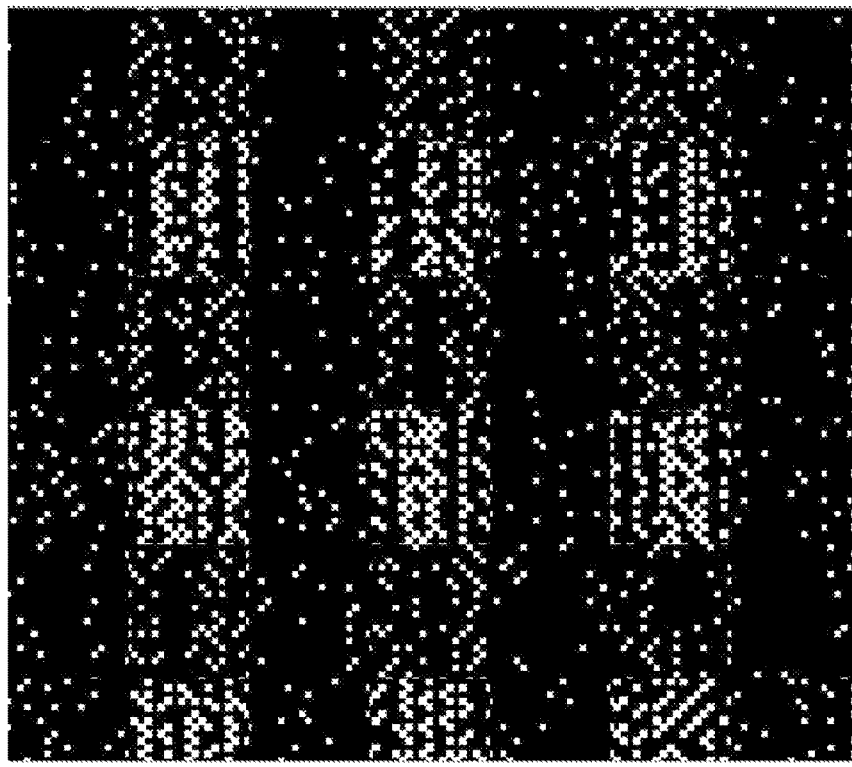
FIG. 26 illustrates a file/image defining a mask design created for the color plates of FIGS. 21-24 by making all non-colored (white) or blank pixels of the image of FIG. 25 opaque.

The method may now continue, after the colored dots/pixels have been separated into blocks or block-shaped sections, with creating another file or digital image. FIG. 26 shows an image 2600 of this file that is made up of all the pixels (or dots) that are blank or absent of any of the colored dots/pixels, i.e., the dots/pixels or spaces shown as being white in image 2500 of FIG. 25. In the image 2600, these pixels are shown as being black to allow the reader to visualize this digital file. The image/file 2600 may be thought of as being very important to the method/fabrication of optical assemblies using a mask and colored block because it contains: (1) interlaced information, meaning pixels from an interlaced image that will create the desired effect (even if a relatively large percentage (e.g., 50 to 75 percent or the like) have been deleted from the first color separation plate for each color of the image); (2) color information, with each section (block) containing the correct percentage and location of color pixels to generate the desired color or tone from the original image; and (3) perfect registration between the sections or blocks (as it is a single file rather than a separate file for each color).

The file/image 2600 is used in the method of fabricating an optical display assembly to produce a mask. The mask can be formed, for example, by using the file/image 2600 and processing a metallized film with a demetallization system, excimer ablation system, or the like such that the mask material has openings or apertures associated with each color pixel in image 2500 (or is at least translucent to light at these locations) and is opaque in non-colored/blank portions of the image 2500. If enough resolution is available, the mask can also be printed with an opaque ink (e.g., a white color) or similar technique to block the needed pixels from showing through from the ink layer/printed image. As discussed above, the mask will be positioned between the lens array and the ink layer/printed image in the optical display assembly, and it is aligned with sets of the lenses in the lens array such that each of these sets focuses on a section of the mask associated with a block/section of color pixels from image 2500 of FIG. 25.

Figure 27:
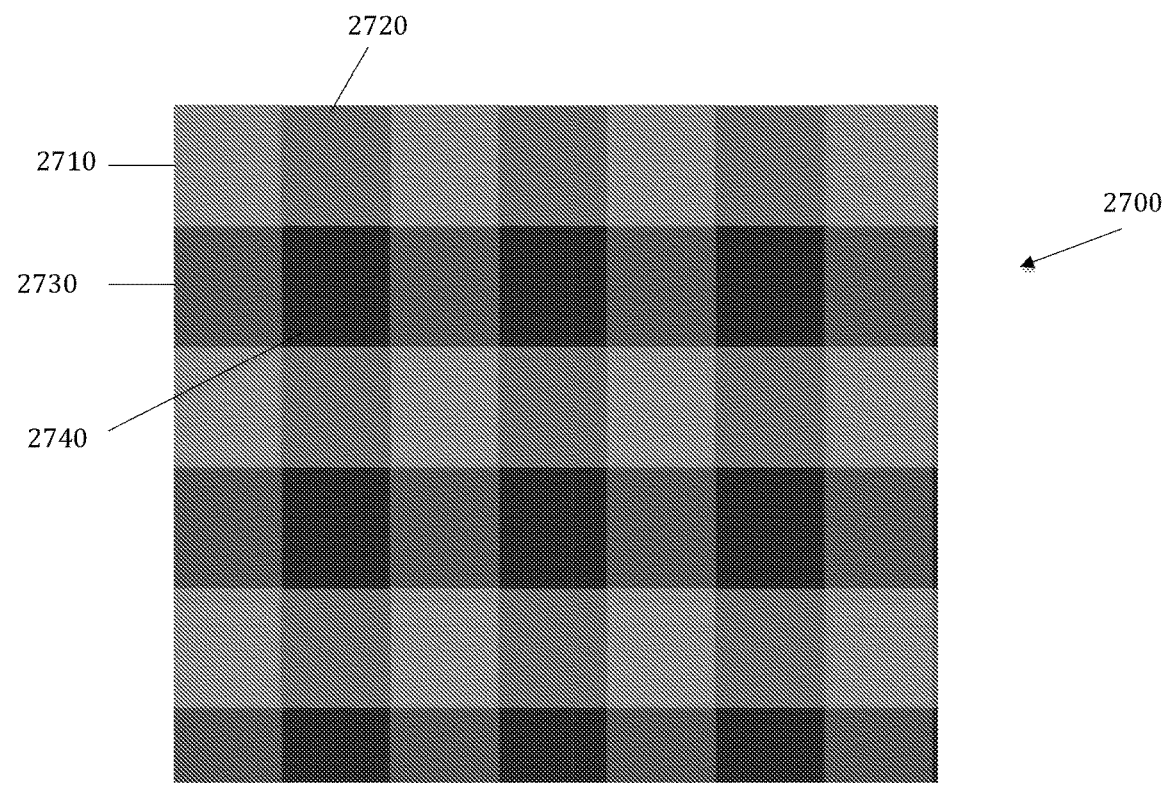
FIG. 27 illustrates a file/image defining an ink layer/printed image for use with the mask of FIG. 26 with a checkboard pattern of four-colored blocks that are registered to the sections/blocks of the image/file of FIG. 25.

The method then continues with printing an ink layer/printed image on the mask or on the substrate such that the mask is sandwiched between the ink layer/printed image and the lens array and such that blocks of each color associated with section/block of color pixels defined by the mask are aligned with or registered to the correct areas of the mask. FIG. 27 shows with image 2700 an exemplary ink layer/ printed image 2700 what has color blocks in a checkboard pattern containing the four (in this example) colors of the full color image. For example, the upper left hand corner of image 2700 includes a color set of a cyan color block 2710, a magenta color block 2720, a yellow color block 2730, and a black color block 2740, and such color sets are repeated in each row and column in the ink layer/printed image. Each of the blocks 2710, 2720, 2730, and 2740 is positioned (or printed) under a portion of the mask formed from image 2600 that defines the pixels/dots where the lens of a set of lenses dedicated to that color will focus to display the color imagery in an optical display assembly. Stated differently, each of the blocks of image/file 2700 corresponds in size, shape, and location with one of the sections/blocks of colored pixels/dots in the image 2500 of FIG. 25. In other words, the mask blocks light in the blank/white pixels of image 2500 and allows lens sets over each of the sections/blocks of colored pixels in image 2500 to focus light onto the color blocks of image 2700.

At this point in the description, it may be useful to describe further the fabrication of the mask 1230 of FIG. 12 using a digital mask file or mask image 1100 shown in FIG. 11. It will also be understood that the optical display assembly or optical security element of the product 1200 of FIG. 12 can be formed free of or without inclusion of the paper/opaque substrate 1210 as the ink layer/color blocks 1220 may be printed over the mask 1230 (e.g., to fill in the holes of the mask with two or more colors) and as the lens array 1240 may include a transparent substrate proximate to the mask 1230 that provides the support structure for the optical security element formed by the lens array 1240 (and any transparent substrate supporting the lenses of array 1240), the mask 1230, and the ink layer/color blocks 1220.

The mask 1230 may be formed by creating an opaque layer of aluminum (or aluminum oxide), gold, silver, or other metal (or compound of such metals), e.g., via metallization on a substrate 1210 or upon the back surface of the lens array 1240 (opposite the round or other shaped micro lenses). In this metal layer-forming step or process, the "solid" metallization is generally deposited in a vacuum metallization system on a clear film, which may be polyethylene terephthalate (PET) or another clear or at least translucent polymer film. This can be done directly on the film or may be on the backside (planar side) of a pre-embossed or cast micro lens film (e.g., upon planar side of lens array 1240). General thicknesses of the metallization layer are between 30 nanometers (nm) and about 1 micron, with 200 to 500 nm being a useful thickness in many applications.

As a next (or additional) step of the method of fabricating an optical security element, a pixel-mapped area generally containing the negative or positive data corresponding to a 3D or animation image (e.g., the mask file or image 1100 of FIG. 11) matching the pitch and design of the micro lenses is reproduced on a flexo, gravure, or micro print cylinder or system. Then, in some embodiments, the positive data is printed on top of the metallized side of the lens array (or substrate including the lens array on a side opposite the metal layer) using a photo resist or chemical resist system lacquer such as via gravure, flexo, micro print or other printing method.

The stack of the lens array, metallization, and lacquer/resist layer is then printed or sent through a chemical bath that is formulated or designed to remove the metallization in the areas where the photoresist/lacquer has not been applied (or areas not covered and protected by the photoresist material). The coating or lacquer protects the metal in the metallization or metal layer where it has been applied, and the metal of the metallization/metal layer is removed in the other unprotected/uncovered areas. The photoresist is often applied using a high-resolution system, and it only requires a thin coating to protect the metallization/metal layer. For example, the printing of the photoresist (e.g., lacquer or the like) may be done at more than 4,000 DPI such as in the range of 4,000 to 12,000 DPI with a resolution proximate to 10,000 DPI being useful for a fine micro lens array. The chemical bath process may involve use of a concentrated sodium hydroxide (NaOH) solution in water to dissolve the exposed (non-coated or non-printed areas) portions of the metallization (e.g., metallic aluminum, gold, silver, or the like). The dissolved metal is then subsequently washed away (e.g., with water), and the fabrication continues with some type of drying operation using infrared (IR) drying, hot air, or the like to remove excess water and/or moisture.

The result of the de-metallization is a mask with a pattern that corresponds to the lenses in the lens array in exact pitch or frequency and that forms an image to the viewer through the lens as a negative image. The "holes" or absence of color have create a "mask" that is highly opaque due to the reflective metallization. These "holes" make up an interlaced image or a moiré image of an element or icon or combination of elements that when combined with the micro lenses of the lens array, form an image to the viewer. The absence of metal in the mask or mask layer presents a "clear area" with no color.

The fabrication process can now continue with printing an image or ink layer (or layer of color blocks) upon the formed mask. A unique part of the printing of the image corresponding to the lenses is that the mask acts as a stencil for the printing process. The holes in the metal layer/mask created by dissolving uncovered metal may now be covered or filled with one, two, three, or more colors (with four colors used in some examples) in a more "crude" way or with less resolution by printing color blocks over areas of the stencil-providing mask. The use of the mask in an optical security element works in part because forming the mask is generally a one-step technique to create all of the two or more colored-pixels (or at least pixel locations) so that all the color pixels are aligned simultaneously. In practice, the formed mask with its opening/holes defining where color pixels are located is the inverse of the pixel map (often defining the C, M, Y, K or other colored pixels in the output from the RIP software, which processes the full color interlaced image). The mask is engineered for color blocks (e.g., a set of four color blocks is repeated throughout the ink layer/printed "image" with each of the four color blocks being underneath a subset of micro lenses of the lens array (such as being under a number of lenses (e.g., a 200 by 300 block of micro lenses or 60,000 micro lenses (or each block may be sized to be under/aligned with 40,000 to 80,000 micro lenses in some embodiments)))).

When the lens system or optical security element/assembly is turned over and viewed from the lens side, only the color corresponding to the clear areas, which are unblocked by the mask, comes back to the viewer to create a high contrast image. The contrast is dramatic as there is no limitation to the density or thickness of the ink layer over the metal mask when viewing through the focusing lens array. In other embodiments of optical security elements, the back of the film or mask need not be printed as the print or ink layer can be applied to the security substrate itself (such as a banknote) as shown with substrate 1210 of FIG. 12. Bright color blocks can be printed, and the feature with the mask may be stamped onto the substrate (e.g., banknote) that is already printed with the color blocks. The color shows through the clear areas or holes or openings in the mask/mask layer, thereby forming the image to the viewer in multiple colors (e.g., two or more colors).

Figure 28:
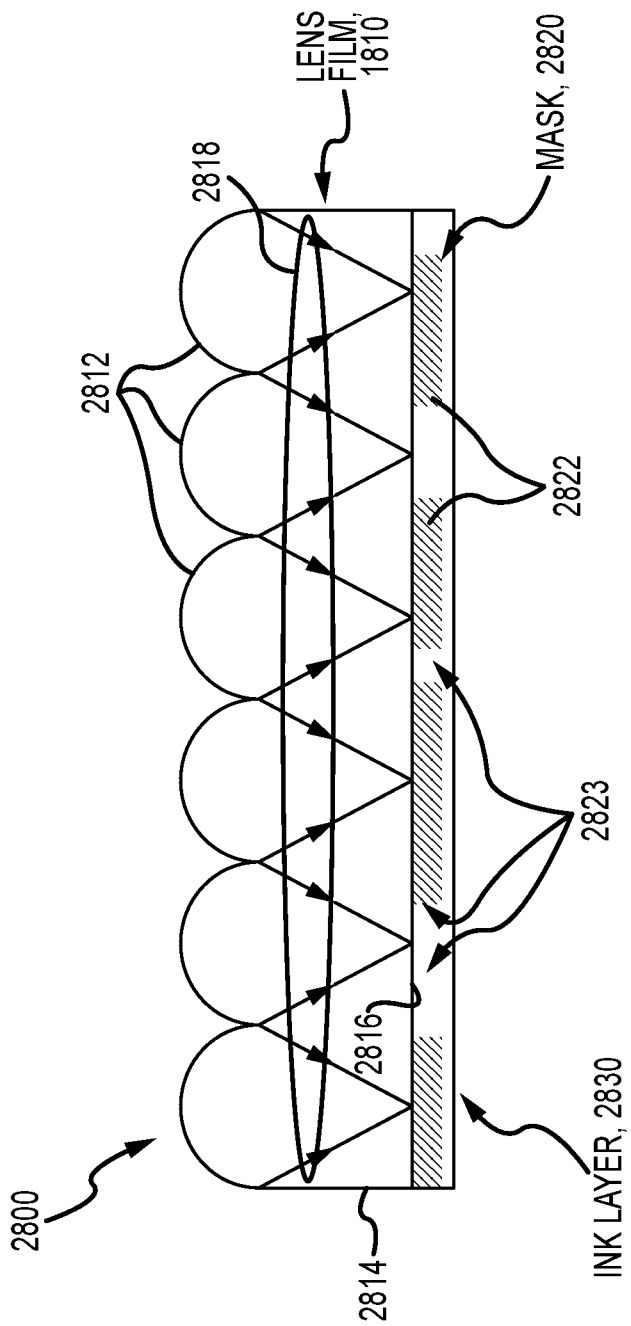
FIG. 28 illustrates an end view of a portion of an optical security element or assembly of the present description illustrating that the lenses are focused onto the ink (colored pixels) that has filled in the holes, gaps, or spaces of the underlying mask.

The following diagrams/figures show the above-described selective metallization and de-metallization processes for forming masks or mask layers work with printing to form useful optical security elements. FIG. 28 illustrates an end or side view of a portion of an optical security element or assembly 2800 of the present description. A small portion of the element 2800 is shown including a lens film with a plurality of lenses 2812 (or a lens array) on a first side of a transparent substrate 2814 (e.g., a PET or other transparent material film) and with a planar second side 2816 opposite the lenses 2812, and, particularly, with only 6 lenses 2812 shown when a typical lens film 2810 would include many thousands of micro lenses.

The optical security element 2800 further includes a mask or mask layer 2820 formed on or positioned to abut the planar second or bottom side 2816 of the lens film or substrate 2810. The mask 2820 includes a plurality of opaque masking elements 2822 (e.g., metallic elements when metallization is used to form mask 2820, ink when printing is used form mask 2820, and so on) and a plurality of holes, openings, or gaps 2823 between the opaque masking elements 2822 (which are spaces or areas of the mask where no metal or other opaque material is present). Additionally, the element 2800 includes a printed ink or image layer 2830 that covers the masking elements 2822 and, more significantly, fills each of the holes, openings, or gaps 2823 to provide one of two or more colors used to form the ink layer 2830 in each of the holes, openings, or gaps 2823 that is visible or viewable through the lens film 2810. As shown with arrows 2818, the lenses 2812 are focused to the back surface 2816 and portions of the ink layer 2830 in the holes, openings, or gaps 2823.

The ink layer 2830 in the optical security element 2800 is configured to provide four blocks of different color (i.e., a four-color block) that are repeated in rows and columns over the entire area of the ink layer 2830. For example, these four colors may follow the CMYK pattern (cyan, magenta, yellow, and key (or black)) used in some useful color printing or another color set to create a color image by combination of colored pixels. In other embodiments, a different number of colors may be combined such as two colors, three colors, or the like in a repeated pattern of printed color blocks.

FIGS. 29A and 29B are lens and back views, respectively, of a larger portion or subsection of the optical security element 2800 of FIG. 28. From the back or ink-side view of optical security element 2800 of FIG. 29B, a portion of the ink layer 2830 can be seen to be made up of four differently-colored blocks 2832, 2834, 2836, and 2838 that are formed by color printing. The portion of element 2800 is larger than that of FIG. 28 because each block 2832-2838 is typically positioned under a subarray of lenses 2812 of the lens film 2810 that is much larger than shown in FIG. 28. For example, each color block 2832, 2834, 2836, 2838 may be sized to cover thousands of micro lenses 2812 with one useful embodiment having the blocks 2832, 2834, 2836, 2838 being rectangular and being under a 200 by 300 subarray of micro lenses 2812 (or being under 60,000 lenses of the lens film 2812). In other cases, the blocks may be square in shape, and the range of micro lenses covered or printed adjacent may be in the range of 40,000 to 80,000 micro lenses. These blocks are much, much larger than individual pixels and can be printed with more accurate alignment or registration with sets or subarrays of micro lenses 2812.

As shown in FIG. 29A with the lens-side view of the optical security element 2800, the mask 2820 visible through the lens film 2810 acts to align numerous pixels from the interlaced color image with each of the four blocks 2832, 2834, 2836, and 2838. The masking elements 2822 block portions of the colors from coming through from the ink layer 2830 while the holes, opening, or gaps 2823 act to define the set of pixels of the interlaced image that are visible through the mask 2820 from the ink layer 2830 for each differently colored block 2832, 2834, 2836, and 2838. Similarly, each set of four colored blocks that is repeated in the ink layer 2830 (pattern shown in FIG. 29B is repeated) is covered with a different portion of the mask 2820 with a different arrangement of masking/opaque elements 2822 and holes 2823 to define different sets of colored pixels for viewing in that portion of the optical security element (e.g., a different group of pixels from the interlaced color image).

Figure 30:
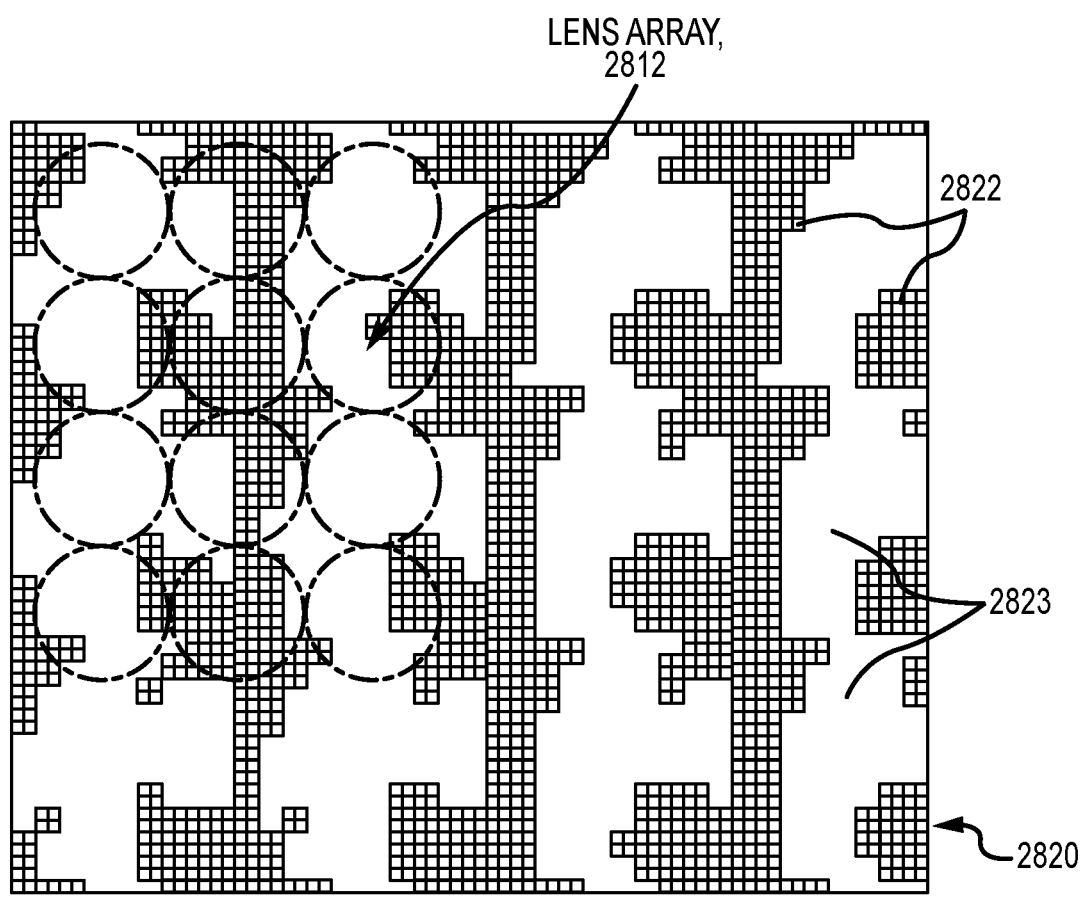
FIG. 30 is another top or lens-side view of a portion of the optical security element of FIG. 28 prior to application of or printing of the ink or image layer.

FIG. 30 is another top or lens-side view of a portion of the optical security element 2800 of FIG. 28 prior to application of or printing of the ink or image layer 2830. This is a smaller portion with a subarray of twelve micro lenses 2812 shown over the mask 2820. The lighter portions (or pixels) of the mask 2820 represent the hole, gaps, or openings 2823 that will be filled or covered with a color ink of choice and will only be viewable as pixels of the displayed image from the top of the lenses 2812 (or from the lens side of the optical security element 2800). The darker portions (or pixels) of the mask 2820 represent the masking elements 2822 (metallic mask or opaque ink mask) that act to block other pixels from view from the top of the lenses 2812 (or from the lens side of the optical security element 2800). With this fabrication process, the color pixels viewable through the holes, openings, or gaps 2823 of the mask 2820 and lenses 2812 of an optical security element 2800 are perfectly synchronized to come back to the viewer at the perfect spacing. The mask 2820 itself may be a single color (e.g., different than the colors of the blocks 2832, 2834, 2836, 2838 or the same) or multiple colors in some embodiments, e.g., a rainbow pattern in ink or foil, stripes, blocks, and the like.

The inclusion of a mask (such as mask 2820 in element 2800 of FIG. 28 and mask 1230 of FIG. 12) of optical security assembly 1200 of FIG. 12) provides numerous advantages and presents numerous features (and/or fabrication steps) that are new to the industry. First, it teaches creation of a lens film with a focusing lens array to a metallization layer (or mask) in the focal length of the lenses (e.g., plus or minus 20 percent of the ideal focus of the lenses) on the same piece of film (e.g., lens on one side and metallization layer/mask on the planar side). The metallization layer/mask may be formed in a de-metallization process for imaging using any chemical de-metallization process. Second, the optical security elements described may be formed using a process of applying a photoresist such as lacquer, varnish, or the like as a protective layer for the applied metal or the metallization in a pattern that corresponds to a negative or positive image to a focusing lens array (round, square, hexagonal, or linear lenses) that is interlaced frames for 3D or animation. The protective layer is applied prior to a chemical bath using chemicals such as sodium hydroxide for removing unprotected portions of the layer of metal/the metallization (such as aluminum, gold, silver, or other metals, oxide of such metals, and/or conductive material) to form a pattern of holes, openings, or gaps defining pixels visible through the mask.

The de-metallization process is used to create an image by de-metallizing a deposited metal layer (e.g., aluminum layer or the like) that is viewable as a negative or positive image. A chemical de-metallization process may be used that includes sodium hydroxide. This forms the mask or mask layer that when used in combination with the lens array upon which it is formed is useful in the creation of an image viewable from the lens side in a pixel mapped 3D or animated image. The inventors teach an opaque "mask," which can be used for a magnifying moiré. The chemical de-metallization process allows the positive or negative image of interlaced pixels or magnifiers corresponding to the lens array to form a 3D or animated image in the form of the leftover metallized area. The fabrication method may include inking or printing the abated areas of the metal layer or metallization (after the chemical bath process) with ink in one or more colors on the back of the lens film (planar side of film with lenses on opposite side or lens film) and in the ablated areas/portions over the de-metallized areas created by the chemical de-metallization process.

A substrate may be printed prior to the application of the lens/de-metallization system film (such as a banknote or security document including, but not limited to, a security badge, a passport, or a driver's license) so that the printed substrate creates color through the "windows" or clear areas in the lens/mask system when the lens/mask system is applied to the bank note or security document (with adhesive or other method). As will be appreciated, the optical security element taught herein with the masks may be used in a banknote or any security document or may be used in labels and/or packaging of products to provide brand enhancement. The optical security element may be provided in a variety of ways on these objects such as a patch for currency, a thread for currency, and so on.

Significantly, as part of fabricating the mask upon or underneath the lens array, the optical pitch of the mask to the lens feature is controlled to provide a match of about 1 to 1 (or within 10 percent of 1 to 1 match, within 5 percent of 1 to 1 match, within 2 percent of 1 to 1 match, or within 1 percent of 1 to 1 match). The ink utilized to form the ink or image layer of colored blocks may be any type of ink. In some cases, the mask is formed of an ink instead of a metal or conductive material, with some embodiments using a chemical bath to remove portions of the ink of the mask layer to create the pattern of holes, openings, or gaps to define pixels visible in the ink or image layer of colored blocks through the ink-based mask. As with other mask formations, the opening or hole pattern is defined by a mask image (or mask file) corresponding to a pixel mapped or interlaced image. The lenses may each be micro lenses with some preferred embodiments using lens arrays with lenses with outer dimensions of less than $10/1000$ inches (or 10 mils).

As an alternative to creating a metallized mask using chemical de-metallization or other techniques, other methods can work for this process to create an image or a mask. For example, microstructures may be embossed with heat and pressure or through ultraviolet light (UV) casting (or soft embossing) onto the back of the film/substrate. Each pixel from the pixel map is represented by a micro cavity in the embossed structures.

Figure 31:
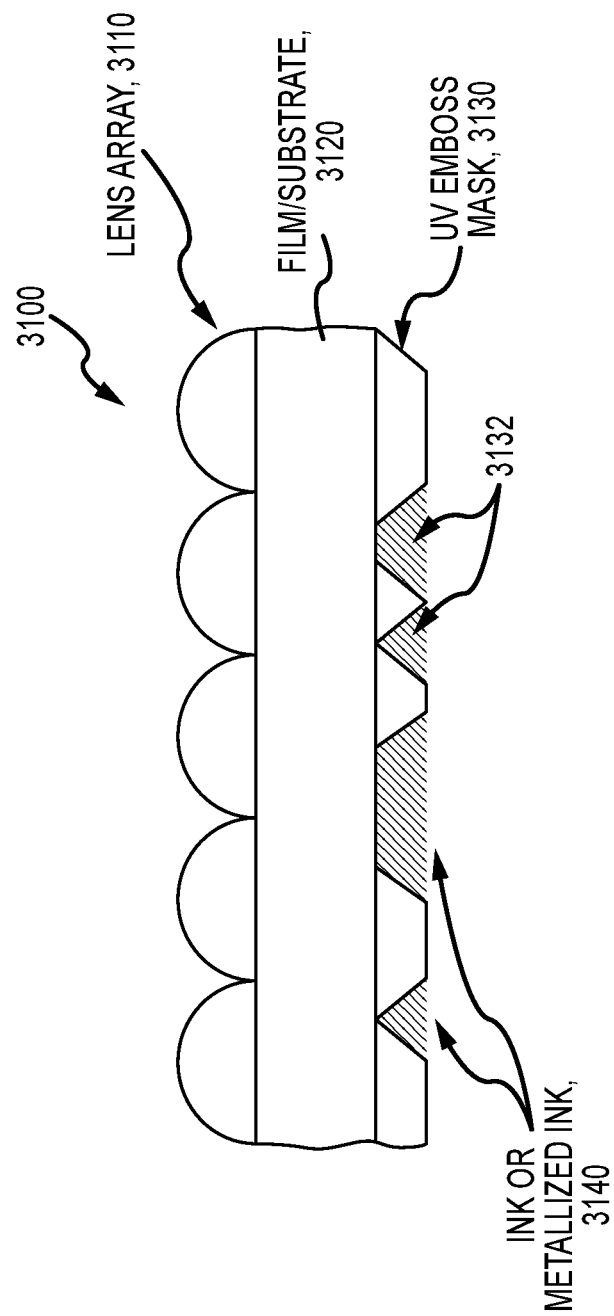
FIG. 31 is a side or end view of a portion of an optical security element with a mask formed using an emboss and fill approach.

FIG. 31 illustrates a small portion of another optical security element 3100 with a lens array 3110 formed on one side of a clear film or substrate 3120. A mask 3130 is formed on the opposite side of the film/substrate 3120 through an emboss and fill approach. Particularly, a clear casting resin (such as a UV curable polyester resin or the like) is applied with cavities 3132 corresponding with each pixel of an image to form a mask 3130, and, then, an ink (or metallized ink) layer 3140 is applied to fill the cavities 3132 to provide the colored pixels of the image visible through the film 3120 and lens array 3110. Generally, the pixel-based micro embossing is done in UV or stamped leaving the corresponding cavities on the backside of the lens film. Then in either an on line or in a separate process, the embossed structure (mask 3130) is filled with a very opaque ink (such as black or dark blue) to form the image. The negative or reverse of the image can also be inked (not shown in FIG. 31 but readily understood by those skilled in the art) with a different color over the top of the mask 3130 creating a two-color effect without print registration (with the second inks being visible through the mask 3130 concurrently with pixels provided by ink 3140). In other cases, the embossed structure can be filled with a reflective silver ink material (e.g., metallized ink) that mirrors the finish of aluminum deposition.

Another useful method for making a mask involves use of gravure printing. In one gravure printing method, the method includes making a gravure printing cylinder that can be imaged with diamond tooling or a photo resist system. Typically, the resolution for the photo resist and diamond tooling is about 1000-5080 DPI, but they can be made at over 50,000 DPI in some photo resist systems. In this embodiment, the ink is printed with transfer into the cavities of the cylinder and then transferred to the substrate. The ink transferred on the planar side of the lens is generally going to be a dark color but could be any opaque color to create a mask system. The color can be independent as a feature (clear in the non-mask areas) or those areas may be filled in with a second, third, or greater number of colors. Metallic colors and black and dark blue are preferable in some applications, but the mask can be any color.

Further, the same type of mask can also be achieve with a fine screen printing method that may be rotary or flat screen printing method. In this method, generally a fine mesh screen is needed to create high resolutions. Just as with the gravure method, the opacity and contrast is important.

In reviewing this description, it may be understood that FIG. 4A is useful for showing one of the original concept that the inventors created that provides the more sophisticated mask/color block system. The underlying fabrication of an optical security element involves: (a) generating or accessing a pixel mapped or interlaced image in full color (CMYK); (b) running the image through the RIP for color separation; (c) obtaining the files corresponding to each color from this process (note that usually those files are used to create the plates (printing plates), containing the specific pixels for each color; (d) instead of creating those plates, the files are modified in the manner described herein so that each file contains blocks (or sections) of dots with that specific color; and (e) finally, recombining those files in a single file. Since the blocks for each color have different positions (they do not overlap), this file contains the information for all colors (see, for example, FIG. 10).

The file from the recombining step is described with reference to FIG. 10, and it can be converted to a single color to become the mask file. This will contain all the colors information perfectly registered in one single plate. The mask can be printed with opaque ink, can be formed with a de-metallization process (e.g., using an excimer laser or the like) or a chemical de-metallization. In the cases of de-metallization, the mask file would be as shown in FIG. 11 that is the inverted image from FIG. 10. Finally the sections of the mask corresponding to each color are registered to the corresponding color blocks that can be printed, and the construction is represented in FIG. 12. Note, the above sequence may also be used to have useful description of FIG. 7.

We claim:

1. A method of fabricating an optical security element, comprising
generating, using color separation, a plate for each of at least two colors from a digital interlaced image, wherein each of the plates comprises a set of digital data defining a number and a location of pixels of a particular color;
dividing each of the plates into a plurality of equally sized sections;
identifying a subset of the sections from each of the plates for use in displaying a color three dimensional (3D) or animated image, wherein a different pattern is used to identify each of the subsets of the sections and wherein the different patterns are configured such that each of the sections has a unique location;
forming a mask on a planar back surface of a lens film that includes a lens array on a surface opposite the planar back surface, wherein the mask includes holes corresponding to the location of the pixels in the identified subsets of the sections and includes opaque masking elements in areas between the holes;
forming a printed image using two or more different colors of ink to print blocks corresponding to the identified subsets of the sections of each of the plates, wherein the printed blocks are arranged in sets of two or more in a repeating pattern; and
mating the printed image with the lens film to form the optical security element with the mask sandwiched between the printed image the lens film, wherein each of the sections in the printed image are positioned underneath a differing subset of micro lenses of the lens array,
wherein the forming of the mask comprises:
performing metallization to form a layer of metal upon the planar back surface;
applying a photoresist in a pattern corresponding to a negative image to the identified subset of the sections from each of the plates for use in displaying the color three dimensional (3D) or animated image;
dissolving portions of the layer of metal uncovered by the photoresist to form the holes using a chemical bath; and
removing the photoresist to expose the opaque masking elements.

2. The method of claim 1, wherein each of the subsets of lenses includes a predefined number of lenses greater than 40,000 lenses with an outer dimension of less than 10 mils.

3. The method of claim 1, wherein the two or more different colors are chosen so that each of the sets of two or more blocks include a cyan block, a magenta block, a yellow block, and a black block.

4. The method of claim 1, wherein the forming and mating steps are performed concurrently.

5. The method of claim 1, wherein the layer of metal comprises aluminum, gold, or silver.

6. The method of claim 1, wherein the photoresist comprises lacquer or varnish.

7. The method of claim 1, wherein the forming of the printed image comprises filling or covering the holes in the mask with the two or more different colors of ink.

8. The method of claim 1, wherein the mask has an optical pitch with a 1 to 1 match to an optical pitch of the lens array and wherein the lens array is configured to focus light onto the mask within plus or minus twenty percent of focal lengths of lenses in the lens array.

9. The method of claim 1, wherein the optical security element is provided in or on a substrate of a banknote, a piece of currency, a financial card, a driver's license, an identification badge, a patch, a passport, or an authenticity label.

10. The method of claim 1, wherein the two or more different colors are chosen so that each of the sets of two or more blocks include a cyan block, a magenta block, a yellow block, and a black block.

11. A lens-based display apparatus useful as an optical security element, comprising:
a lens array with a first side comprising a plurality of lenses and a second side opposite the first side;
an ink layer comprising blocks formed of ink of a first color arranged in a first pattern and blocks formed of ink of a second color arranged in a second pattern differing from the first pattern; and
a mask proximate to the second side of the lens array and positioned between the ink layer and the lens array,
wherein the mask includes a first set of openings defining a first set of pixels that are filled or covered with the ink of the first color, the mask further includes a second set of openings defining a second set of pixels that are filled or covered with the ink of the second color, and the mask includes opaque masking elements between the openings,
wherein the first set of openings are arranged into a first set of sections that are arranged in a third pattern matching the first pattern of the blocks,
wherein the second set of openings are arranged into a second set of sections that are arranged in a fourth pattern matching the second pattern of the blocks,
wherein the first set of openings are located underneath a first set of the lenses of the lens array,
wherein the second set of openings are located underneath a second set of the lenses of the lens array that differs from the first set of the lenses,
wherein the first set of pixels corresponds with a subset of pixels of a first color plate for an interlaced image or for a magnifying moiré, and
wherein the second set of pixels corresponds with a subset of pixels of a second color plate for the interlaced image or magnifying moiré.

12. The apparatus of claim 11, wherein the interlaced image is a full color image, wherein the mask includes third and fourth sets of openings defining third and fourth sets of pixels from third and fourth color plates for the interlaced image, and wherein the printed image further comprises blocks formed of ink of a third color and arranged in a third pattern and blocks formed of ink of a fourth color and arranged in a fourth pattern differing from the first, second, and third patterns.

13. The apparatus of claim 11, wherein the first and second patterns are selected such that the blocks of the first and second colors of ink are arranged in a checkboard pattern, wherein the lenses are micro lenses with an outer dimension less than 10 mils, and wherein a 1 to 1 match is provided between optical pitch of the mask to the lens array.

14. The apparatus of claim 11, wherein the mask comprises a layer of metal formed by de-metallization of a metallized film to form the openings or comprises a layer of opaque ink.

15. The apparatus of claim 11, wherein the mask comprises a layer of metal formed by de-metallization of a metallized film to form the openings or comprises a layer of opaque ink.

16. A method of fabricating a lens-based display assembly, comprising:
using color separation to generate a plate for each of at least two colors from a digital interlaced image, each of the plates comprising a set of digital data defining a number and a location of pixels of a particular color;
dividing each of the plates into a plurality of equally sized sections;
identifying a subset of the sections from each of the plates, wherein a different pattern is used to identify each of the subsets of the sections and wherein the different patterns are configured such that each of the sections is assigned a unique location;
generating a combination plate including all of the subsets of the sections of the at least two colors;
processing the combination plate to form a file defining a mask with openings at the locations of the pixels in the subsets of the sections and with opaque areas at locations in the combination plate free of the pixels in the subsets of the sections;
forming a mask layer, using the file defining the mask, comprising holes corresponding to the pixels in the subsets of the sections and opaque masking elements corresponding to the opaque areas;
providing an ink layer over the mask layer using a different color of ink to print a color block that is matched in size and location with the subsets of the sections, thereby forming a checkboard pattern of the color blocks; and
mating the mask layer and the ink layer with a lens array,
wherein each of the color blocks in the printed image are positioned underneath a differing subset of lenses of the lens array,
wherein the mask layer is sandwiched between the ink layer and the lens array with the holes covered or filled with the ink,
wherein the pixels of the first color are arranged in patterns under the lenses that differ from patterns of the pixels of the second color under the lenses, whereby the lenses exclusively focus for a viewer on locations of the pixels of the first color or the pixels of the second color.

17. The method of claim 16, wherein the lens array comprises a plurality of round lenses, aspherical lenses, square lenses, or hexagonal lenses each with an outer dimension of less than 10 mils, wherein the mask layer has an optical pitch with a 1 to 1 match to an optical pitch of the lens array, and wherein the lens array is configured to focus light onto the mask layer within plus or minus twenty percent of focal lengths of the lenses in the lens array.

18. The method of claim 16, wherein the forming of the mask layer comprises using gravure printing or screen printing to print the opaque masking elements corresponding with the lens array.

19. The method of claim 16, wherein the forming of the mask layer comprises:
performing metallization to form a layer of metal upon a planar back surface of the lens array
applying lacquer or varnish in a pattern corresponding to a negative image of the combination plate;
dissolving portions of the layer of metal uncovered by the photoresist to form the holes using a chemical bath; and
removing the lacquer or varnish to expose the opaque masking elements,
wherein the layer of metal comprises at least one of aluminum, gold, and silver.

20. A method of fabricating an optical security element, comprising
generating a plate from a digital image defining a number and a location of pixels;
forming a mask on a planar back surface of a lens film that includes a lens array on a surface opposite the planar back surface, wherein the mask includes cavities corresponding to the location of the pixels of the plate and includes clear or opaque masking elements in areas between the cavities and wherein the forming comprises micro embossing; and
forming a printed image by filling the cavities with ink.

21. The method of claim 20, wherein the micro embossing comprises applying a UV casting resin upon the planar back surface.

22. The method of claim 20, wherein the ink is a metallized ink.

23. The method of claim 20, wherein the masking elements are clear and wherein the method further comprises forming a negative of the image by applying ink of a different color than the ink filling the cavities over the masking elements, thereby creating a two-color effect without print registration.

24. A mask for a lens-based display assembly with a lens array, comprising:
opaque masking elements,
wherein the opaque masking elements correspond with the lens array and are formed with a photoresist, screen printing ink, or gravure printing ink,
wherein the opaque masking elements are formed using a magnifying moiré, and
wherein the magnifying moiré is under 15 mils.

25. A method of fabricating an optical security element, comprising
generating, using color separation, a plate for each of at least two colors from a digital interlaced image, wherein each of the plates comprises a set of digital data defining a number and a location of pixels of a particular color;
dividing each of the plates into a plurality of equally sized sections;
identifying a subset of the sections from each of the plates for use in displaying a color three dimensional (3D) or animated image, wherein a different pattern is used to identify each of the subsets of the sections and wherein the different patterns are configured such that there no co-located ones of the sections;
forming a mask on a planar back surface of a lens film that includes a lens array on a surface opposite the planar back surface, wherein the mask includes holes corresponding to the location of the pixels in the identified subsets of the sections and includes opaque masking elements in areas between the holes;
forming a printed image using two or more different colors of ink to print blocks corresponding to the identified subsets of the sections of each of the plates, wherein the printed blocks are arranged in sets of two or more in a checkerboard pattern; and
mating the printed image with the lens film to form the optical security element with the mask sandwiched between the printed image the lens film,
wherein each of the sections in the printed image are positioned underneath a differing subset of micro lenses of the lens array, and wherein the forming of the mask comprises applying a layer of opaque ink on the planar back surface the lens film.

26. The method of claim 25, wherein each of the subsets of lenses includes a predefined number of lenses greater than 40,000 lenses with an outer dimension of less than 10 mils.

27. The method of claim 25, wherein the mask has an optical pitch with a 1 to 1 match to an optical pitch of the lens array and wherein the lens array is configured to focus light onto the mask within plus or minus twenty percent of focal lengths of lenses in the lens array.

28. The method of claim 25, wherein the optical security element is provided in or on a substrate of a banknote, a piece of currency, a financial card, a driver's license, an identification badge, a patch, a passport, or an authenticity label.

29. A method of fabricating an optical security element, comprising
generating, using color separation, a plate for each of at least two colors from a digital interlaced image, wherein each of the plates comprises a set of digital data defining a number and a location of pixels of a particular color;
dividing each of the plates into a plurality of equally sized sections;
identifying a subset of the sections from each of the plates for use in displaying a color three dimensional (3D) or animated image, wherein a different pattern is used to identify each of the subsets of the sections and wherein the different patterns are configured such that there no co-located ones of the sections;
forming a mask on a planar back surface of a lens film that includes a lens array on a surface opposite the planar back surface, wherein the mask includes holes corresponding to the location of the pixels in the identified subsets of the sections and includes opaque masking elements in areas between the holes;
forming a printed image using two or more different colors of ink to print blocks corresponding to the identified subsets of the sections of each of the plates, wherein the printed blocks are arranged in sets of two or more in a checkerboard pattern; and
mating the printed image with the lens film to form the optical security element with the mask sandwiched between the printed image the lens film,
wherein each of the sections in the printed image are positioned underneath a differing subset of micro lenses of the lens array, and
wherein the forming of the mask comprises gravure printing or screen printing.

30. The method of claim 29, wherein each of the subsets of lenses includes a predefined number of lenses greater than 40,000 lenses with an outer dimension of less than 10 mils.

31. The method of claim 29, wherein the two or more different colors are chosen so that each of the sets of two or more blocks include a cyan block, a magenta block, a yellow block, and a black block.

32. The method of claim 29, wherein the mask has an optical pitch with a 1 to 1 match to an optical pitch of the lens array and wherein the lens array is configured to focus light onto the mask within plus or minus twenty percent of an ideal focus focal lengths of lenses in the lens array.

33. The method of claim 29, wherein the optical security element is provided in or on a substrate of a banknote, a piece of currency, a financial card, a driver's license, an identification badge, a patch, a passport, or an authenticity label.

34. A method of fabricating an optical security element, comprising
generating, using color separation, a plate for each of at least two colors from a digital interlaced image, wherein each of the plates comprises a set of digital data defining a number and a location of pixels of a particular color;
dividing each of the plates into a plurality of equally sized sections;
identifying a subset of the sections from each of the plates for use in displaying a color three dimensional (3D) or animated image, wherein a different pattern is used to identify each of the subsets of the sections and wherein the different patterns are configured such that there no co-located ones of the sections;
forming a mask on a planar back surface of a lens film that includes a lens array on a surface opposite the planar back surface, wherein the mask includes holes corresponding to the location of the pixels in the identified subsets of the sections and includes opaque masking elements in areas between the holes;
forming a printed image using two or more different colors of ink to print blocks corresponding to the identified subsets of the sections of each of the plates, wherein the printed blocks are arranged in sets of two or more in a checkerboard pattern; and
mating the printed image with the lens film to form the optical security element with the mask sandwiched between the printed image the lens film,
wherein each of the sections in the printed image are positioned underneath a differing subset of micro lenses of the lens array,
wherein the mask has an optical pitch with a 1 to 1 match to an optical pitch of the lens array, and
wherein the lens array is configured to focus light onto the mask within plus or minus twenty percent of focal lengths of the lenses in the lens array.

35. The method of claim 34, wherein each of the subsets of lenses includes a predefined number of lenses greater than 40,000 lenses with an outer dimension of less than 10 mils.

36. The method of claim 34, wherein the two or more different colors are chosen so that each of the sets of two or more blocks include a cyan block, a magenta block, a yellow block, and a black block.

37. The method of claim 34, wherein the optical security element is provided in or on a substrate of a banknote, a piece of currency, a financial card, a driver's license, an identification badge, a patch, a passport, or an authenticity label.

38. A lens-based display apparatus useful as an optical security element, comprising:
a lens array with a first side comprising a plurality of lenses and a second side opposite the first side;
an ink layer comprising blocks formed of ink of a first color arranged in a first pattern and blocks formed of ink of a second color arranged in a second pattern differing from the first pattern; and
a mask proximate to the second side of the lens array and positioned between the ink layer and the lens array,
wherein the mask includes a first set of openings associated with a first set of pixels that are filled or covered with the ink of the first color, the mask further includes a second set of openings associated with a second set of pixels that are filled or covered with the ink of the second color, and the mask includes opaque masking elements between the openings, wherein the first set of openings are arranged into a first set of sections that are arranged in a third pattern matching the first pattern of the blocks, wherein the second set of openings are arranged into a second set of sections that are arranged in a fourth pattern matching the second pattern of the blocks, wherein the first set of openings are located underneath a first set of the lenses of the lens array, wherein the second set of openings are located underneath a second set of the lenses of the lens array that differs from the first set of the lenses, wherein the first and second patterns are selected such that the blocks of the first and second colors of ink are arranged in a checkboard pattern, wherein the lenses are micro lenses with an outer dimension less than 10 mils, and wherein a 1 to 1 match is provided between optical pitch of the mask to the lens array.

39. The apparatus of claim 38, wherein the first set of pixels corresponds with a subset of pixels of a first color plate for an interlaced image or for a magnifying moiré, wherein the second set of pixels corresponds with a subset of pixels of a second color plate for the interlaced image or magnifying moiré, wherein the interlaced image is a full color image, wherein the mask includes third and fourth sets of openings associated with third and fourth sets of pixels from third and fourth color plates for the interlaced image, and wherein the printed image further comprises blocks formed of ink of a third color and arranged in a third pattern and blocks formed of ink of a fourth color and arranged in a fourth pattern differing from the first, second, and third patterns.

40. A lens-based display apparatus useful as an optical security element, comprising:

a lens array with a first side comprising a plurality of lenses and a second side opposite the first side;

an ink layer comprising blocks formed of ink of a first color arranged in a first pattern and blocks formed of ink of a second color arranged in a second pattern differing from the first pattern; and a mask proximate to the second side of the lens array and positioned between the ink layer and the lens array, wherein the mask includes a first set of openings associated with a first set of pixels that are filled or covered with the ink of the first color, the mask further includes a second set of openings associated with a second set of pixels that are filled or covered with the ink of the second color, and the mask includes opaque masking elements between the openings, wherein the first set of openings are arranged into a first set of sections that are arranged in a third pattern matching the first pattern of the blocks, wherein the second set of openings are arranged into a second set of sections that are arranged in a fourth pattern matching the second pattern of the blocks, wherein the first set of openings are located underneath a first set of the lenses of the lens array, wherein the second set of openings are located underneath a second set of the lenses of the lens array that differs from the first set of the lenses, and wherein the mask comprises a layer of metal formed by de-metallization of a metallized film to form the openings or comprises a layer of opaque ink.

41. The apparatus of claim 40, wherein the first set of pixels corresponds with a subset of pixels of a first color plate for an interlaced image or for a magnifying moiré, wherein the second set of pixels corresponds with a subset of pixels of a second color plate for the interlaced image or magnifying moiré, wherein the interlaced image is a full color image, wherein the mask includes third and fourth sets of openings associated with third and fourth sets of pixels from third and fourth color plates for the interlaced image, and wherein the printed image further comprises blocks formed of ink of a third color and arranged in a third pattern and blocks formed of ink of a fourth color and arranged in a fourth pattern differing from the first, second, and third patterns.

42. A method of fabricating a lens-based display assembly, comprising:

using color separation to generate a plate for each of at least two colors from a digital interlaced image, each of the plates comprising a set of digital data defining a number and a location of pixels of a particular color;

dividing each of the plates into a plurality of equally sized sections;

identifying a subset of the sections from each of the plates, wherein a different pattern is used to identify each of the subsets of the sections and wherein the different patterns are configured such that there no co-located ones of the sections;

generating a combination plate including all of the subsets of the sections of the at least two colors;

processing the combination plate to form a file defining a mask with openings at the locations of the pixels in the subsets of the sections and with opaque areas at locations in the combination plate free of the pixels in the subsets of the sections;

forming a mask layer, using the file defining the mask, comprising holes corresponding to the pixels in the subsets of the sections and opaque masking elements corresponding to the opaque areas;

providing an ink layer over the mask layer using a different color of ink to print a color block that is matched in size and location with the subsets of the sections, thereby forming a checkboard pattern of the color blocks; and mating the mask layer and the ink layer with a lens array, wherein each of the color blocks in the printed image are positioned underneath a differing subset of lenses of the lens array, wherein the mask layer is sandwiched between the ink layer and the lens array with the holes covered or filled with the ink, and wherein the forming of the mask layer comprises using gravure printing or screen printing to print the opaque masking elements corresponding with the lens array.

43. The method of claim 42, wherein the lens array comprises a plurality of round lenses, aspherical lenses, square lenses, or hexagonal lenses each with an outer dimension of less than 10 mils, wherein the mask layer has an optical pitch with a 1 to 1 match to an optical pitch of the lens array, and wherein the lens array is configured to focus light onto the mask layer within plus or minus twenty percent of focal lengths of the lenses in the lens array.

44. A method of fabricating a lens-based display assembly, comprising:

using color separation to generate a plate for each of at least two colors from a digital interlaced image, each of the plates comprising a set of digital data defining a number and a location of pixels of a particular color;

dividing each of the plates into a plurality of equally sized sections;

identifying a subset of the sections from each of the plates, wherein a different pattern is used to identify each of the subsets of the sections and wherein the different patterns are configured such that there no co-located ones of the sections;

generating a combination plate including all of the subsets of the sections of the at least two colors;

processing the combination plate to form a file defining a mask with openings at the locations of the pixels in the subsets of the sections and with opaque areas at locations in the combination plate free of the pixels in the subsets of the sections;

forming a mask layer, using the file defining the mask, comprising holes corresponding to the pixels in the subsets of the sections and opaque masking elements corresponding to the opaque areas;

providing an ink layer over the mask layer using a different color of ink to print a color block that is matched in size and location with the subsets of the sections, thereby forming a checkboard pattern of the color blocks; and mating the mask layer and the ink layer with a lens array, wherein each of the color blocks in the printed image are positioned underneath a differing subset of lenses of the lens array, wherein the mask layer is sandwiched between the ink layer and the lens array with the holes covered or filled with the ink, and wherein the forming of the mask layer comprises:
performing metallization to form a layer of metal upon a planar back surface of the lens array applying lacquer or varnish in a pattern corresponding to a negative image of the combination plate;

dissolving portions of the layer of metal uncovered by the photoresist to form the holes using a chemical bath; and removing the lacquer or varnish to expose the opaque masking elements, wherein the layer of metal comprises at least one of aluminum, gold, and silver.

45. The method of claim 44, wherein the lens array comprises a plurality of round lenses, aspherical lenses, square lenses, or hexagonal lenses each with an outer dimension of less than 10 mils, wherein the mask layer has an optical pitch with a 1 to 1 match to an optical pitch of the lens array, and wherein the lens array is configured to focus light onto the mask layer within plus or minus twenty percent of focal lengths of the lenses in the lens array.

* * * * *